(12) United States Patent
Tada et al.

(10) Patent No.: US 6,559,477 B2
(45) Date of Patent: May 6, 2003

(54) FLAT PANEL DISPLAY DEVICE AND METHOD FOR MANUFACTURING THE SAME

(75) Inventors: Norio Tada, Fukaya (JP); Hideo Yoshihashi, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/964,403

(22) Filed: Sep. 28, 2001

(65) Prior Publication Data

US 2002/0039814 A1 Apr. 4, 2002

(30) Foreign Application Priority Data

Sep. 29, 2000 (JP) .......................... 2000-300833
Mar. 30, 2001 (JP) .......................... 2001-102451

(51) Int. Cl.$^7$ .............................................. H01L 29/04
(52) U.S. Cl. ............................. 257/59; 257/68; 257/69; 257/72; 438/147; 438/151; 438/155; 438/164
(58) Field of Search ................................. 438/149, 151, 438/155, 164; 257/59, 69, 72, 68

(56) References Cited

U.S. PATENT DOCUMENTS

| | | | | |
|---|---|---|---|---|
| 5,403,772 A | * | 4/1995 | Zhang et al. | |
| 5,712,495 A | * | 1/1998 | Suzawa | |
| 6,297,518 B1 | * | 10/2001 | Zhang | |
| 6,433,361 B1 | * | 8/2002 | Zhang et al. | |
| 6,441,399 B1 | * | 8/2002 | Koyama et al. | |

FOREIGN PATENT DOCUMENTS

JP  3092570  6/1998

\* cited by examiner

*Primary Examiner*—Long Pham
(74) *Attorney, Agent, or Firm*—Pillsbury Winthrop LLP

(57) ABSTRACT

A flat panel display device comprising a thin film semiconductor switching element formed on a surface of a substrate, a display electrode connected with the switching element, a semiconductor layer for auxiliary capacity which is electrically connected with the display electrode, a dielectric layer formed on a surface of the semiconductor layer for auxiliary capacity, and a metal layer formed on a surface of the dielectric layer, wherein the auxiliary capacity is constituted by the semiconductor layer for auxiliary capacity, the dielectric layer, and the metal layer, and the semiconductor layer for auxiliary capacity is implanted all over the surface thereof with a high concentration of impurity ion.

7 Claims, 12 Drawing Sheets

FLAT PANEL DISPLAY DEVICE AND METHOD FOR MANUFACTURING THE SAME

CROSS-REFERENCE TO RELATED APPLICATIONS

This application is based upon and claims the benefit of priority from the prior Japanese Patent Applications No. 2000-300833, filed Sep. 29, 2000; and No. 2001-102451, filed Mar. 30, 2001, the entire contents of both of which are incorporated herein by reference.

BACKGROUND OF THE INVENTION

1. Field of the Invention

The present invention relates to a flat panel display device and to the manufacturing method thereof, and for example, to an active matrix type liquid crystal display device, and to the manufacturing method thereof.

2. Description of the Related Art

The flat panel display device generally makes use of an auxiliary capacity in order to obtain a picture image of high quality, and in particular, makes use of an auxiliary capacity having an MOS (Metal Oxide Semiconductor) structure wherein a dielectric layer is sandwiched between a semiconductor layer and a metal layer in order to simplify the manufacturing method thereof.

As a typical example of this flat panel display device, there is known a liquid crystal display device for example. Since the liquid crystal display device is greatly advantageous in that it can be made thin and light-weight, and that the power consumption thereof is very low, the liquid crystal display device is extensively employed for a television, a word processor, and various kinds of office automation apparatus such as a display for personal computer.

As for the driving system of the liquid crystal display device, an active matrix type driving system is mainly employed, because of the fact that the active matrix type driving system is capable of obtaining an image of larger area and higher quality as compared with a simple matrix type driving system. This active matrix type driving system is designed such that a driving voltage is transmitted via a switching element to a liquid crystal, and one of the characteristics thereof is the memory retention action thereof. Namely, since this active matrix type driving system is capable of suppressing a leakage of electric charges kept in the auxiliary capacity even after the switching element has been turned OFF, it becomes possible to obtain an image of high quality.

However, there are a number of problems in this conventional liquid crystal display device provided with an auxiliary capacity having an MOS structure wherein a dielectric layer is sandwiched between a semiconductor layer and a metal layer. Namely, since a high voltage is always impressed to the dielectric layer in order to hold a capacity to a constant value, the dielectric layer tends to deteriorate, thus leading to an increase in the generation of leak current between the semiconductor layer and metal electrode or leading to the generation of short-circuit between the semiconductor layer and metal layer, thus resulting in the generation of point defect and hence deteriorating the quality and reliability of the display device.

BRIEF SUMMARY OF THE INVENTION

It is an object of the present invention to provide a flat panel display device provided with an auxiliary capacity having a structure wherein a dielectric layer is sandwiched between a semiconductor layer and a metal layer, the flat panel display device being featured in that it is capable of minimizing voltage dependency of the auxiliary capacity, thereby making it possible to achieve a normal display even if a driving voltage is low.

It is another object of the present invention to provide a flat panel display device provided with an auxiliary capacity having a structure wherein a dielectric layer is sandwiched between a semiconductor layer and a metal layer, the flat panel display device being featured in that it is capable of minimizing point defects to be generated due to a deterioration of the dielectric layer, thus exhibiting excellent quality and reliability.

It is still another object of the present invention to provide a method of manufacturing a flat panel display device provided with an auxiliary capacity having a structure wherein a dielectric layer is sandwiched between a semiconductor layer and a metal layer, the method being featured in that it is capable of minimizing voltage dependency of the auxiliary capacity, thereby making it possible to achieve a normal display even if a driving voltage is low.

It is still another object of the present invention to provide a method of manufacturing a flat panel display device provided with an auxiliary capacity having a structure wherein a dielectric layer is sandwiched between a semiconductor layer and a metal layer, the method being featured in that it is capable of minimizing point defects to be generated due to a deterioration of the dielectric layer, thus enabling it to obtain a flat panel display device exhibiting excellent quality and reliability.

According to the present invention, there is provided a flat panel display device comprising:
  a thin film semiconductor switching element formed on a surface of a substrate;
  a display electrode connected with the switching element;
  a semiconductor layer for auxiliary capacity which is electrically connected with the display electrode;
  a dielectric layer formed on a surface of the semiconductor layer for auxiliary capacity; and
  a metal layer formed on a surface of the dielectric layer;
wherein the auxiliary capacity is constituted by the semiconductor layer for auxiliary capacity, the dielectric layer, and the metal layer; and the switching element includes a channel region, and a semiconductor layer having source and drain regions disposed to sandwich the channel region therebetween and implanted respectively with an n-type or p-type impurity ion, the impurity ion having the same as the impurity ion concentration being implanted into the source/drain regions is implanted into the semiconductor layer for auxiliary capacity in the same step, a surface concentration of the n-type or p-type impurity ion is in the range of $3.2 \times 10^{19}$ to $2.0 \times 10^{20}$ atoms/cm$^3$.

Further, according to the present invention, there is provided a method of manufacturing a flat panel display device comprising: a thin film semiconductor switching element formed on a surface of a substrate; a display electrode connected with the switching element; a semiconductor layer for auxiliary capacity which is electrically connected with the display electrode; a dielectric layer formed on a surface of the semiconductor layer for auxiliary capacity; and a metal layer formed on a surface of the dielectric layer; wherein the auxiliary capacity is constituted by the semiconductor layer for auxiliary capacity, the dielectric layer, and the metal layer;

the method comprising the steps of:
- depositing a layer of the semiconductor switching element on the substrate concurrent with a deposition of the semiconductor layer for auxiliary capacity on the substrate;
- forming a mask pattern covering a region of the switching element which is subsequently turned into a channel region but exposing entire surfaces of source/drain regions of the switching element and of the semiconductor layer for auxiliary capacity;
- implanting an impurity ion through the mask pattern into entire surfaces of source/drain regions of the switching element and of the semiconductor layer for auxiliary capacity;
- depositing a metal layer and subjecting the metal layer to a patterning process to thereby form a gate electrode of the switching element and an auxiliary capacity line facing the semiconductor layer for auxiliary capacity.

Furthermore, according to the present invention, there is provided a flat panel display device comprising:
- a thin film semiconductor switching element, and a thin film semiconductor element for driving circuit, both being formed on a surface of a substrate;
- a display electrode connected with the switching element;
- a semiconductor layer for auxiliary capacity which is electrically connected with the display electrode;
- a dielectric layer formed on a surface of the semiconductor layer for auxiliary capacity; and
- a metal layer formed on a surface of the dielectric layer;
- wherein the auxiliary capacity is constituted by the semiconductor layer for auxiliary capacity, the dielectric layer, and the metal layer;
- the thin film semiconductor element for driving circuit is provided with a semiconductor layer having a channel region bearing thereon a gate insulating film, and source/drain regions sandwiching the gate insulating film, each of source/drain regions being implanted with a predetermined concentration of impurity ions; and
- the gate insulating film of the thin film semiconductor element for driving circuit contains not more than $1.1 \times 10^{13}/cm^2$ in the number of defects per unit area.

Still further, according to the present invention, there is provided a flat panel display device comprising:
- a thin film semiconductor switching element formed on a surface of a substrate;
- a display electrode connected with the switching element;
- a semiconductor layer for auxiliary capacity which is electrically connected with the display electrode;
- a dielectric layer formed on a surface of the semiconductor layer for auxiliary capacity; and
- a metal layer formed on a surface of the dielectric layer;
- wherein the auxiliary capacity is constituted by the semiconductor layer for auxiliary capacity, the dielectric layer, and the metal layer; and the switching element includes a channel region, and a semiconductor layer having source and drain regions disposed to sandwich the channel region therebetween and implanted respectively with an n-type or p-type impurity ion, the impurity ion having the same as the impurity ion concentration being implanted into the source/drain regions is implanted into the semiconductor layer for auxiliary capacity in the same step, a carrier concentration thereof is $1.6 \times 10^{19}$ atoms/cm$^3$ or more.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 8A to 8G respectively shows a cross-sectional view illustrating sequentially the manufacturing step of the liquid crystal display device according to a first aspect of the present invention;

DETAILED DESCRIPTION OF THE INVENTION

Figure 1:
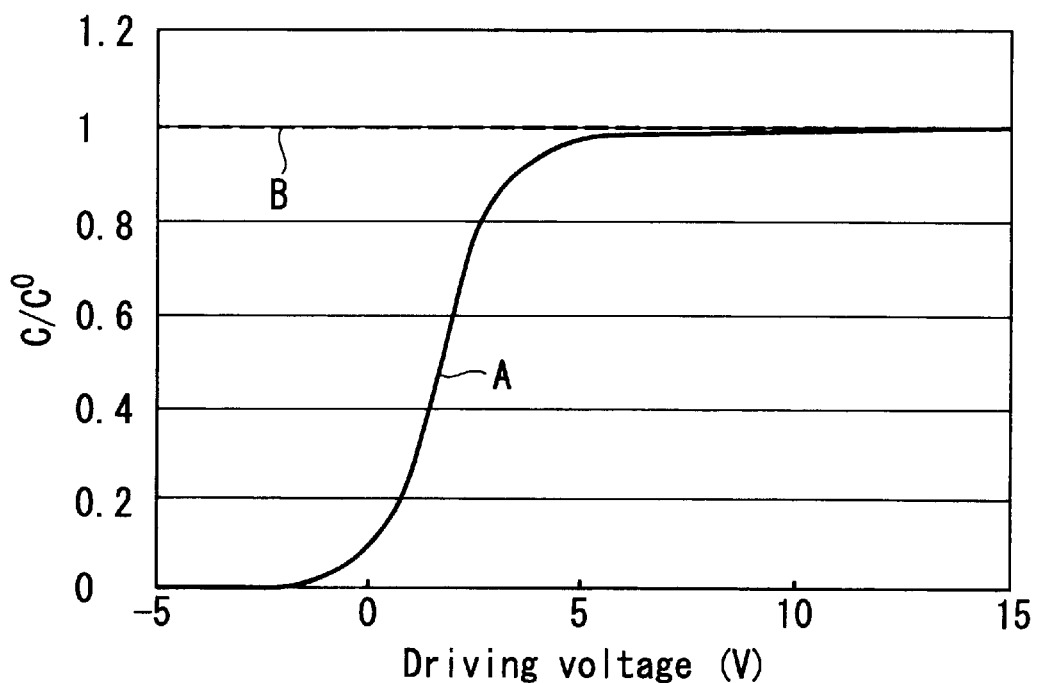
FIG. 1 is a graph illustrating the C-V characteristics of the auxiliary capacity of liquid crystal display device.
Figure 2:
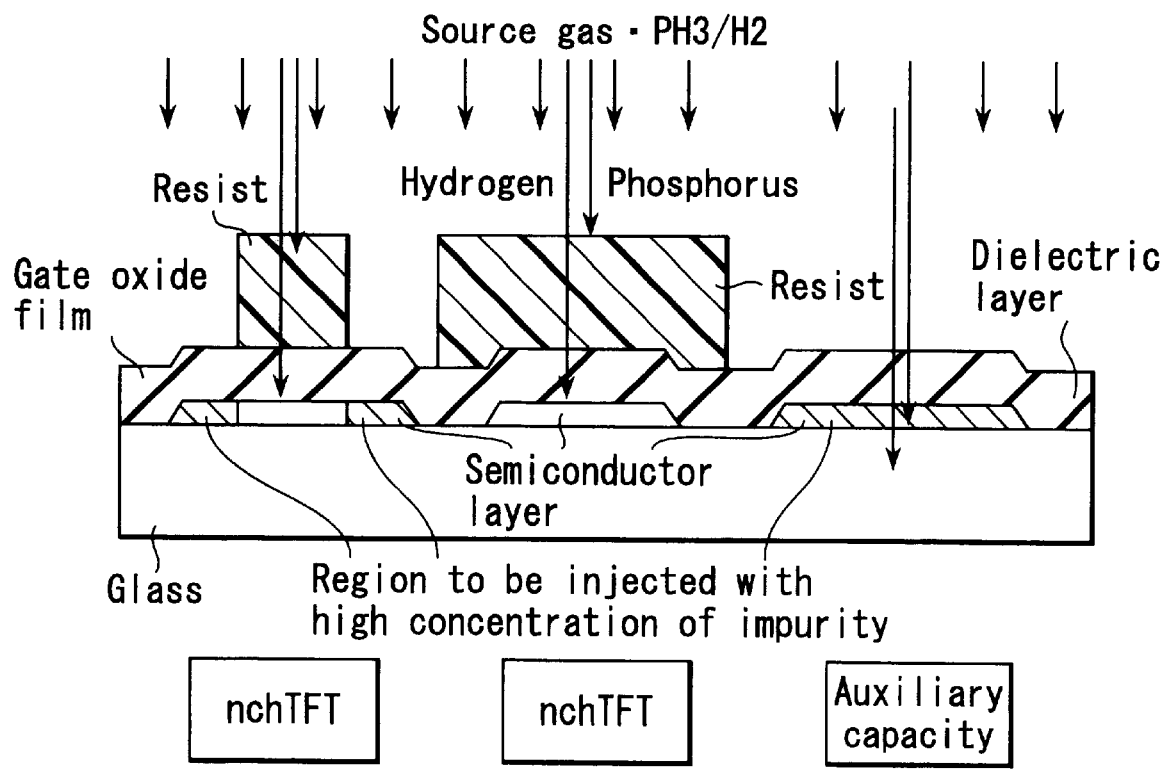
FIG. 2 is a cross-sectional view schematically illustrating the step of implanting a high concentration of impurity into a semiconductor layer of auxiliary capacity.

The flat panel display device according to a first aspect of the present invention is featured in that a high concentration of impurity is implanted entirely into the semiconductor layer for auxiliary capacity.

It is preferable, in the flat panel display device according to this first aspect, that the surface concentration of an n-type or p-type impurity ion in the semiconductor layer for auxiliary capacity may preferably be in the range of $3.2 \times 10^{19}$ to $2.0 \times 10^{20}$ atoms/cm$^3$, more preferably in the range of $4.1 \times 10^{19}$ to $9.0 \times 10^{19}$ atoms/cm$^3$.

Further, the switching element may be constructed such that it is provided with a semiconductor layer having a channel region, and source/drain regions disposed to sandwich the channel region therebetween and implanted respectively with an impurity ion, wherein the concentration of impurity ion to be implanted into the semiconductor layer for auxiliary capacity may be approximately the same as the impurity ion concentration implanted into the source/drain regions.

In this case, the surface concentration of an n-type or p-type impurity ion in the source/drain regions may preferably be in the range of $3.2 \times 10^{19}$ to $2.0 \times 10^{20}$ atoms/cm$^3$, more preferably in the range of $4.1 \times 10^{19}$ to $9.0 \times 10^{19}$ atoms/cm$^3$.

If the concentration of the n-type or p-type impurity ion in the semiconductor layer for the auxiliary capacity, or the concentration of the n-type or p-type impurity ion in the source/drain regions is less than $3.2 \times 10^{19}$ atoms/cm$^3$, it may become difficult to obtain the effects aimed at by the present invention. On the other hand, if the concentration of impurity ion in these layer and regions exceeds over $2.0 \times 10^{20}$ atoms/cm$^3$, the crystal in the semiconductor layer may be badly damaged.

The impurity ion in the semiconductor layer for the auxiliary capacity may preferably be mainly comprise phosphorus.

An effective concentration of the impurity ions in the impurity ions activated by heat treatment may 50 percent of the entire impurity ions. Accordingly, it can be obtained the semiconductor layer for the auxiliary capacity having a carrier concentration of $1.6 \times 10^{19}$ atoms/cm$^3$ or more.

Thus, when the carrier concentration of the semiconductor layer for the auxiliary capacity is $1.6 \times 10^{19}$ atoms/cm$^3$ or more, it is possible to suppress a voltage dependency of the auxiliary capacity.

The flat panel display device according to the first aspect of the present invention, which is constructed as described above, can be manufactured by a method wherein a mask pattern covering a prospective channel region of switching element but exposing entire surfaces of source/drain regions of the switching element and of a semiconductor layer for auxiliary capacity is formed on a dielectric layer covering the semiconductor layer of the switching element, or covering the semiconductor layer for auxiliary capacity; and then, an n-type or p type impurity ion is implanted, through this mask, all over the source/drain regions of the switching element as well as all over the semiconductor layer for auxiliary capacity.

The switching element, in the aforementioned manufacturing method of a flat panel display device, is provided with a semiconductor layer having a channel region bearing thereon a gate insulating film, and source/drain regions sandwiching the gate insulating film, each of source/drain regions being implanted with a predetermined concentration of impurity ions, wherein a concentration of hydrogen in the gate insulating film of switching element and in the semiconductor layer is preferably controlled to not more than $1 \times 10^{21}$ (atoms/cm$^3$).

In this case, as described above, the semiconductor layer for auxiliary capacity should preferably be implanted entirely with an n-type or p-type impurity ion at a concentration of $3.2 \times 10^{19}$ to $2 \times 10^{20}$ atoms/cm$^3$.

By the way, where all the impurity ions generated in the step of an ion implantation are implanted without mass separation, hydrogen to be implanted in the gate insulating film of switching element and in the semiconductor layer is injected concurrent with the implantation of impurity ion into the semiconductor layer for auxiliary capacity.

The controlling of the concentration of hydrogen in the gate insulating film of switching element and in the semiconductor layer to not more than $1 \times 10^{21}$ (atoms/cm$^3$) can be performed by the following methods.

(1) The film thickness of the resist covering the switching element on the occasion of injecting impurity ion should be made larger. For example, the film thickness of the resist should preferably be in the range of about 1.3 to 1.5 $\mu$m.

(2) The impurity ions are implanted over the gate insulating film of the switching element and of the dielectric layer for the auxiliary capacity, the film thickness of the gate insulating film of the switching element and of the dielectric layer for auxiliary capacity should be made thinner, and at the same time, the concentration of impurity ions to be implanted should be reduced. For example, the film thickness of the gate insulating film should preferably be in the range of about 720 to 880 nm, and the concentration of impurity ions to be implanted should preferably be controlled to about $1.5 \times 10^{15}$ atoms/cm$^2$.

(3) The concentration of hydrogen in a source gas on the occasion of injecting an impurity ion should be reduced. For example, the concentration of hydrogen should preferably be controlled to 20% or less.

By the way, the number of defects (number of unpaired electron) per unit volume which may exist in the gate insulating film of switching element and in the semiconductor layer can be controlled to not more than $6.91 \times 10^{18}$ atoms/cm$^3$ by controlling the concentration of hydrogen in the gate insulating film of switching element and in the semiconductor layer to not more than $1 \times 10^{21}$ atoms/cm$^3$.

The flat panel display device according to a second aspect of the present invention is featured in that the number of defects (number of unpaired electron) per unit area which may exist in the gate insulating film of the thin film semiconductor element for driving circuit is controlled to not more than $1.1 \times 10^{13}$ atoms/cm$^2$.

In this case, as described above, the semiconductor layer for auxiliary capacity should desirably be entirely implanted with an impurity ion in such a degree that a concentration of the impurity ion therein falls within the range of $3.2 \times 10^{19}$ atoms/cm$^3$ to $2.0 \times 10^{20}$ atoms/cm$^3$.

The flat panel display device according to the second aspect of the present invention, which is constructed as described above, can be manufactured by a method wherein a plasma ashing for removing the mask employed on the occasion of injecting an impurity into the source/drain regions of thin film semiconductor element for driving circuit and into the semiconductor layer for auxiliary capacity is performed under a condition which makes it possible to limit the number of defects (number of unpaired electron) per unit area which may exist in the gate insulating film of the thin film semiconductor element for driving circuit to not more than $1.1 \times 10^{13}$/cm$^2$.

As for the condition which makes it possible to limit the number of defects (number of unpaired electron) per unit area which may exist in the gate insulating film of the thin film semiconductor element for driving circuit to not more than $1.1 \times 10^{13}/cm^2$, it may be selected such that after finishing the step of injecting an impurity ion, the mask is removed by an ashing treatment with the ashing power being set to not more than 1000W.

Next, the principle and effects of the flat panel display device according to one aspect of the present invention will be explained in detail as follows.

As a result of repeated experiments, it has been made clear by the present inventors that the cause for deterioration of dielectric layer in the structure of auxiliary capacity can be attributed mainly to a high driving voltage.

This finding on the cause for deterioration of dielectric layer will be explained in detail hereinafter, taking a liquid crystal display device as one example of the flat panel display device.

An active matrix type liquid crystal display device which is widely employed as a typical example of liquid crystal display device frequently employs a thin film transistor (TFT) as a switching element. The manufacturing process of this TFT usually involves steps of successively laminating a semiconductor layer, a dielectric layer and a metal layer on a substrate in the mentioned order. As a result, when an auxiliary capacity is to be utilized in a liquid crystal display device employing the TFT, an auxiliary capacity of MOS structure where a dielectric layer is interposed between a semiconductor layer and a metal layer is frequently employed for the purpose of simplifying the manufacturing process.

According to this conventional structure of auxiliary capacity, only part of the semiconductor layer can be doped with impurity. The reason for adopting this structure is to simplify the manufacturing process. This conventional structure however necessitates an increase of driving voltage of the liquid crystal display device.

It has been found out, as a result of repeated experiments by the present inventors for investigating the ratio of generating point defect due to the deterioration of dielectric layer, that a liquid crystal display device exhibiting a high driving voltage would inevitably lead to an increase in point defects.

Therefore, it is assumed that in the case of the flat panel display device where a dielectric layer is interposed between a semiconductor layer and a metal electrode, the deterioration of dielectric layer can be inhibited by lowering the driving voltage.

However, since it becomes difficult, in the case of the conventional flat panel display device, to normally maintain the display thereof under a condition where the driving voltage is made lower, it has been impossible to lower the driving voltage.

This problem will be discussed more in detail taking a liquid crystal display device as an example.

In order to normally maintain the display of liquid crystal display device, the ratio of fluctuation of auxiliary capacity is required to be minimal within the range of driving voltage. Specifically, if the maximum value of capacity within the range of driving voltage is defined as $C_{max}$, if the minimum value thereof is defined as $C_{min}$, and if the difference therebetween is defined as $\Delta C = C_{max} - C_{min}$, the ratio of fluctuation of auxiliary capacity $\Delta C/C_{max}$ is required to be controlled to not more than 1%.

However, since it has been impossible, according to the auxiliary capacity of the conventional liquid display device, to secure a sufficient capacity at a lower range of voltage, it is required, for the purpose of minimizing the ratio of fluctuation of capacity, to drive the display device at a higher range of voltage.

FIG. 1 shows the C-V characteristics of the auxiliary capacity of liquid crystal display device. In FIG. 1, the curve A represents the C-V characteristics of the auxiliary capacity of the conventional MOS structure wherein a dielectric layer is sandwiched between a semiconductor layer and a metal layer. In this case, a voltage $V_{cs}$ is applied to the metal layer, and a voltage $V_{sig}$ is applied to the semiconductor layer, and hence, the driving voltage is $V_{cs}-V_{sig}$. The abscissa in FIG. 1 denotes the driving voltage. The ordinate in FIG. 1 denotes a value to be obtained as the auxiliary capacity C is divided by the capacity Co of dielectric layer. In this case, $C_o$ is a constant, and the maximum value of $C/C_o$ is 1.

As indicated by the curve A of FIG. 1, according to the auxiliary capacity of the conventional liquid crystal display device, since the capacity can hardly be formed as the driving voltage becomes lower, it is required, in order to minimize the ratio of fluctuation of capacity, to drive the display device using a voltage of higher range. For example, in the example indicated by the curve A of FIG. 1, the voltage is required to be set to 6V or more. Namely, when the voltage $V_{sig}$ to be applied to the semiconductor layer is set to the range of 1 to 9V, the voltage $V_{cs}$ to be applied to the metal layer becomes 15V, and the driving voltage becomes as high a range as 6V to 14V.

Whereas, according to the first aspect of the present invention, the aforementioned problem is dissolved by implanting a high concentration of impurity ion into the semiconductor layer for auxiliary capacity. Namely, the structure of auxiliary capacity is turned into an MOS structure where the semiconductor layer thereof is doped with a high concentration of impurity. As a result, as shown by a straight line B of FIG. 1, the capacity becomes no longer dependent on the voltage, thereby making it possible to reduce the electric field to be applied to the dielectric layer.

In this case, the step of injecting a high concentration of impurity ion into the semiconductor layer of auxiliary capacity is performed concurrent with the ion implantation to the source/drain regions of nch(pch) TFT. It would be required, on this occasion, to cover all over the surfaces of the channel portion of nch(pch) TFT as well as of the pch(nch) TFT by making use of a resist mask.

Since the source gas to be employed on the occasion of injecting an impurity is formed of a gas wherein a dopant gas is diluted with hydrogen to about 30%, where the source gas is introduced without mass separation, a quantity of hydrogen which is about three times as large as that of the dopant is caused to be injected concurrent with the ion implantation of the dopant. Since hydrogen is lighter in weight than the dopant and can be injected deeper than the dopant, hydrogen is allowed to pass through a resist layer if the film thickness of the resist is thin, thus allowing hydrogen to reach the gate insulating film of TFT and also the semiconductor layer. If so, it will lead to the generation of defects in the gate insulating film of the channel region of thin film transistor as well as in the semiconductor layer, thereby leading to the deterioration of performance of TFT such as the increase of the threshold value thereof or the lowering of mobility.

Whereas, when the concentration of hydrogen in the gate insulating film of the thin film transistor and in the semiconductor layer is limited to not more than $1 \times 10^{21}$ (atoms/cm$^3$), such problems as mentioned above can be overcome.

The controlling of the concentration of hydrogen in the gate insulating film of the thin film transistor and in the semiconductor layer to not more than $1 \times 10^{21}$ (atoms/cm$^3$) can be achieved by the aforementioned methods, i.e. by making larger the film thickness of the resist mask of the TFT portion on the occasion of ion implantation, by reducing the concentration of impurity to be implanted (which leads to the thinning of the gate insulating film of TFT and the dielectric layer of auxiliary capacity), and by reducing the concentration of hydrogen to be employed for the dilution. When the concentration of hydrogen in the gate insulating film and in the semiconductor layer is reduced to not more than $1 \times 10^{21}$ (atoms/cm$^3$) in this manner, the deterioration of performance of TFT can be prevented.

Figure 3:
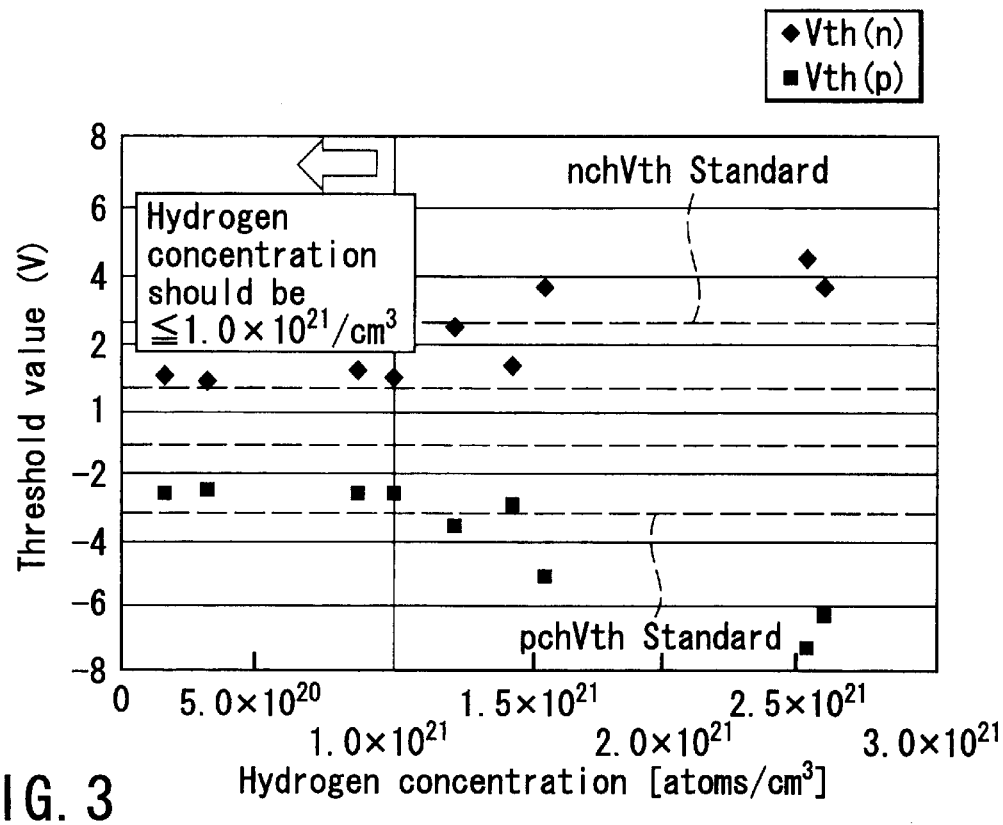
FIG. 3 is a graph illustrating the relationship between the concentration of hydrogen to be implanted into a gate insulating film and into a semiconductor layer and the threshold value of TFT.

By the way, when hydrogen is injected into the gate insulating film of TFT and into the semiconductor layer, it will lead to the generation of defects, to the deterioration of the characteristics of TFT, and to an increase of threshold value. The relationship between the concentration of hydrogen in the gate insulating film and in the semiconductor layer and the threshold value of TFT is shown in FIG. 3. As seen from FIG. 3, if the concentration of hydrogen exceeds over $1 \times 10^{21}$ (atoms/cm$^3$), the threshold value is increased in both nch TFT and pch TFT, exceeding over the standard of threshold value. Therefore, it will be understood that the concentration of hydrogen should preferably be controlled to not more than $1 \times 10^{21}$ (atoms/cm$^3$).

When the concentration of hydrogen in the gate insulating film of TFT and in the semiconductor layer is reduced to not more than $1 \times 10^{21}$ (atoms/cm$^3$) in this manner, the deterioration in performance of TFT can be prevented even if the structure of auxiliary capacity is constituted by an MOS structure, thereby making it possible to realize a liquid crystal display device exhibiting high quality and high reliability.

On the other hand, with regard to the active matrix type liquid crystal display device, it becomes increasingly popular recently to produce a new type of liquid crystal display device where polysilicon is employed for constituting the active layer, so that not only the conventional transistor for writing an electric potential in a pixel but also the transistor constituting a circuit for driving the conventional transistor is concurrently fabricated on the surface of substrate.

According to the liquid crystal display device of this type, a thin film transistor employing polysilicon for constituting the driving circuit is employed therein. However, since the function demanded of the transistor for writing an electric potential in individual pixel is conventionally limited simply to the switching operation of ON/OFF, the degree of freedom to such characteristics is relatively large. Whereas, the characteristics demanded of the transistor for constituting the driving circuit involve the precise controlling of the threshold value and of the mobility.

Namely, the characteristics demanded of the transistor include the characteristics to be demanded at the time when the manufacture thereof has been finished, and also the characteristics to be demanded after the actual use thereof for some time. Namely, in a sense to guarantee the reliability of device that has been manufactured, the characteristics thereof is required to meet the standard even after the actual use thereof for some time. As a main cause for fluctuating the characteristics after the actual use thereof for some time, there is a movable ion existing inside the gate insulating film.

Generally, if an ion such as sodium ion or hydrogen ion exists inside a silicon oxide film to be employed as a gate insulating film, the ion existing inside the film is caused to move inside the silicon oxide film due to the gate voltage to be applied to the film at the time of operating the transistor, thereby changing the distribution of ion in the film, thus shifting the threshold value of transistor. Therefore, in order to prevent the characteristics of the transistor from fluctuating from the initial state thereof even after the actual use thereof for some time, the concentration of these ions in the gate insulating film is required to be limited to not more than some degree.

Among these ions, sodium ion is caused to generate due to the contamination during the manufacturing steps thereof, so that the inclusion of sodium ion can be prevented by carefully performing the schedule control. In the case of hydrogen ion however, the circumstances thereof differs from those of sodium ion. Since the liquid crystal display device is usually fabricated on the surface of glass substrate of large area in contrast with the transistor which is usually fabricated on the surface of silicon substrate, the silicon oxide film to be employed as a gate insulating film is frequently formed of a deposition film to be formed by means of plasma CVD.

As compared with a thermal oxide film which can be formed through a thermal oxidation of silicon and is generally employed in a transistor to be formed on the surface of silicon substrate, a large quantity of hydrogen is permitted to be included in the silicon oxide film that has been formed by means of plasma CVD. Therefore, if only part of this large quantity of hydrogen is permitted to become a movable ion, it will lead to a fluctuation in a large magnitude of threshold value, so that how to prevent this large quantity of hydrogen ions from being turned into a movable ion becomes an important key point.

However, since a large quantity of hydrogen are inherently existed in a silicon oxide film that has been formed by means of plasma CVD as mentioned above, it has been very difficult to control the hydrogen to be turned into a movable ion by simply controlling the quantity of hydrogen.

Whereas, according to a second aspect of the present invention, the density of defects (number of unpaired electron) per unit area in the gate insulating film is limited to not more than $1.1 \times 10^{13}$/cm$^2$, thereby making it possible to obtain a liquid crystal display device which is minimal in fluctuation in characteristics of transistor and high in reliability even after the actual use thereof for some time.

The effects to be achieved by the second aspect of the present invention are as follows.

Namely, the hydrogen which is contained in a silicon oxide film formed by means of plasma CVD and may be turned into a movable ion is inherently existed in the form of Si—H at the time when the oxide film is formed. This Si—H bond is then cut off during a subsequent processes to thereby generate hydrogen. As this hydrogen moves inside the oxide film, the characteristics of transistor is caused to fluctuate. Therefore, the fluctuation of characteristics of transistor can be minimized by inhibiting, as far as possible, this Si—H bond in the oxide film from being cut off.

Specifically, the manufacturing process of a flat panel display device, e.g. a liquid crystal display device should be performed in such a manner that a mask pattern covering a prospective channel region of thin film semiconductor element for driving circuit is formed at first, and then, an impurity ion is injected through this mask pattern into entire surfaces of source/drain regions of the thin film semiconductor element for driving circuit and of the semiconductor layer for auxiliary capacity, which is followed by a step of removing the mask by means of plasma ashing treatment, which should be performed under the condition that makes it possible to inhibit the cut-off of the Si—H bond in the gate insulating film, e.g. silicon oxide film.

As for the condition for such a plasma ashing treatment, it is possible adopt a method to limit the power of ashing to not more than 1000W for instance.

Figure 4:
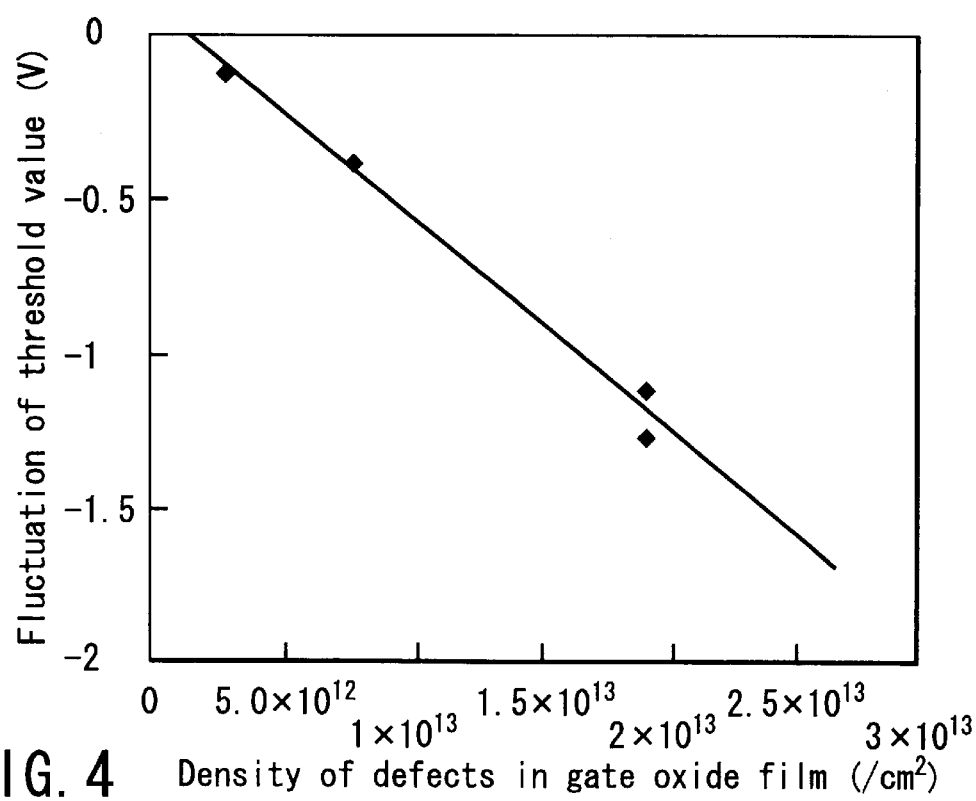
FIG. 4 is a graph illustrating the relationship between the density of defects in a gate insulating film and the variation of threshold value.

Since the density of defects (unpaired electron) in the gate insulating film is identical with the density of unbonded Si—which will be produced as a result of the cut-off of the Si—H bond, i.e. the density of the hydrogen that will be turned into the troublesome movable ion among the hydrogen existing in large quantities in the gate insulating film, the fluctuation of characteristics of transistor after the actual use thereof for some time can be minimized (to not more than 0.6V) by limiting the density of the hydrogen to be turned into the movable ion to not more than $1.1 \times 10^{13}/cm^2$ (FIG. 4). It would be possible in this way to obtain a liquid crystal display device which is minimal in fluctuation of the characteristics of transistor and excellent in reliability.

In the followings, various embodiments of the present invention will be explained with reference to drawings. In these embodiments, a liquid crystal display device is exemplified as one example of the flat panel display device.

The liquid crystal display device according to a first embodiment of the present invention belongs to the first aspect of the present invention and is featured in that a high concentration of impurity is implanted into the semiconductor layer of auxiliary capacity. There will be herein described mainly an auxiliary capacity arranged in each pixel. The same may be said of an auxiliary capacity arranged in a driving circuit part.

First of all, the main structure of the liquid crystal display device according to this first embodiment will be explained with reference to FIGS. 5 to 7.

Figure 5:
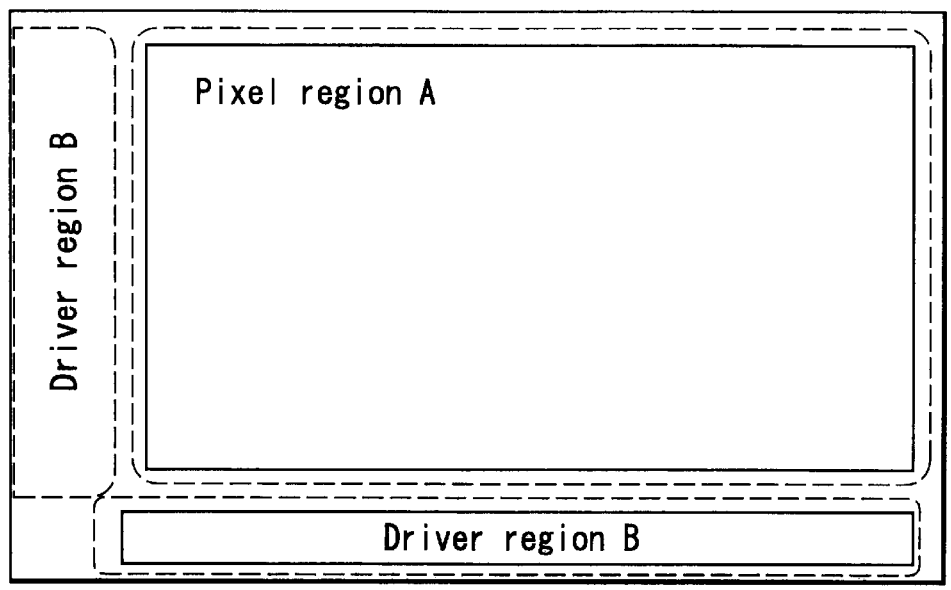
FIG. 5 is a plan view illustrating the entire structure of liquid crystal display device according to a first aspect of the present invention.

FIG. 5 shows a plan view illustrating the entire structure of the liquid crystal display device according to this first embodiment. This liquid crystal display device is of active matrix type and is constituted by a pixel section A and a driver section (driving circuit section) B.

Figure 6:
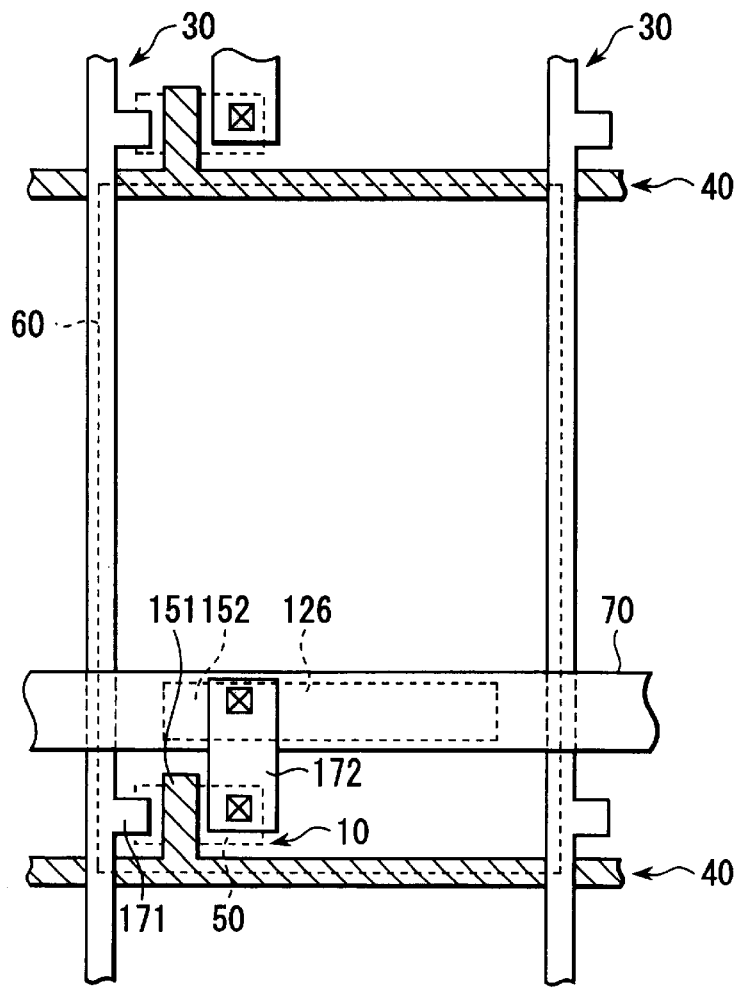
FIG. 6 is an enlarged plan view illustrating the pixel portion of liquid crystal display device according to a first aspect of the present invention.

FIG. 6 shows a plan view wherein a part of the pixel section of the liquid crystal display device according to this embodiment is enlarged. Referring to FIG. 6, a pixel electrode 60 is formed as a display electrode in the region which is encircled by a couple of adjacent scanning lines 40 and a couple of adjacent signal lines 30. Further, a thin film transistor for pixel switching (hereinafter referred to as pixel TFT) 10 is formed at the intersecting portion between the scanning lines 40 and the signal lines 30, so that the pixel electrode 60 is connected with the scanning lines 40 and also with the signal lines 30 through this pixel TFT 10.

Furthermore, an auxiliary capacity line 70 functioning as an electrode for forming the auxiliary capacity is disposed parallel with the scanning lines 40, and a semiconductor layer 126 for auxiliary capacity is disposed below this auxiliary capacity line 70. Thus, an auxiliary capacity of MOS structure is fabricated by these auxiliary capacity line 70, gate insulating film and the semiconductor layer 126 for auxiliary capacity. The gate insulating layer formed between the auxiliary capacity line 70 and the semiconductor layer 126 for auxiliary capacity functions as a dielectric layer.

Figure 7:
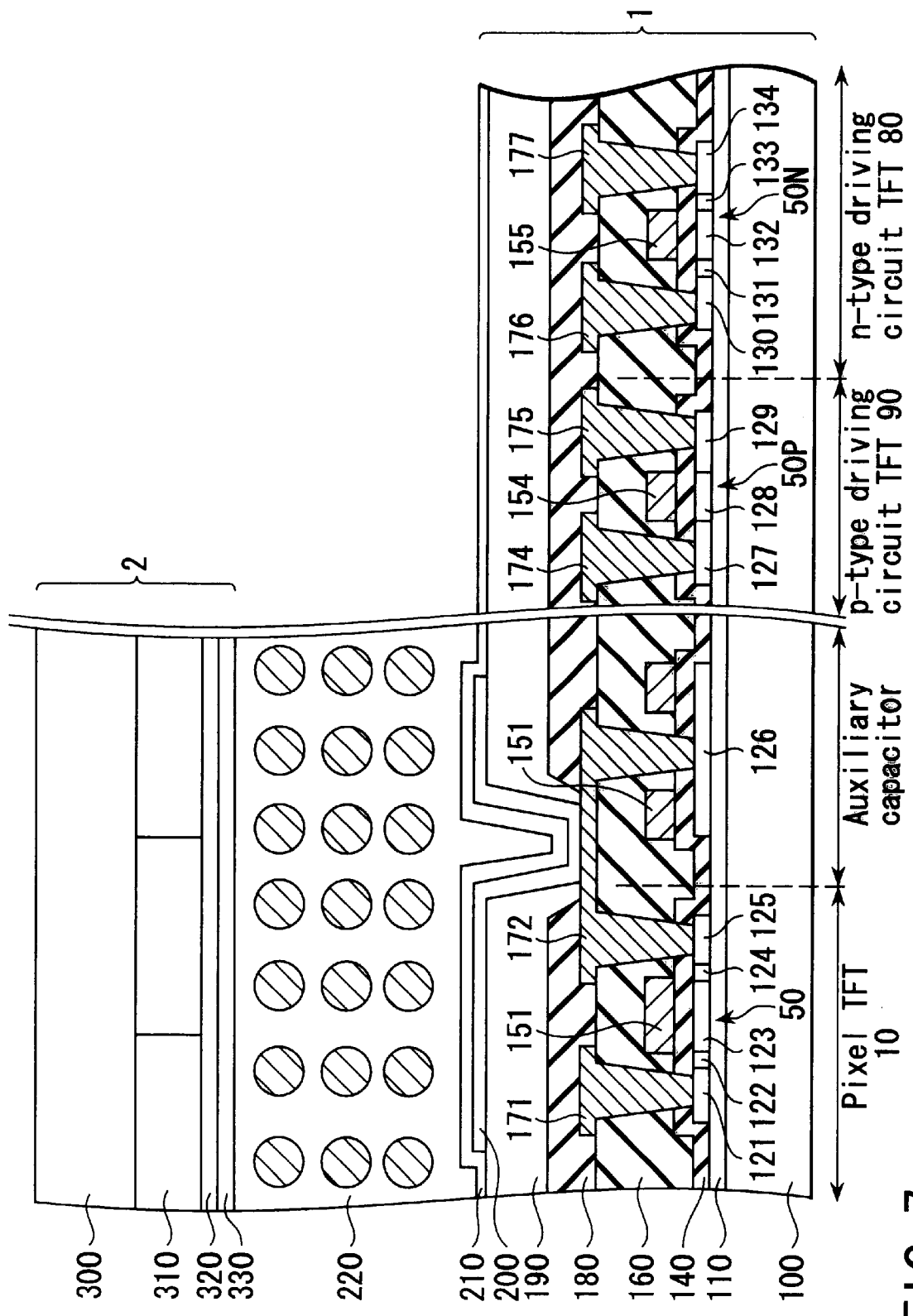
FIG. 7 is a cross-sectional view schematically illustrating a structure including a pixel portion A and a driver portion B of liquid crystal display device according to a first aspect of the present invention.

FIG. 7 shows a schematical cross-sectional view of the structure comprising the pixel section A and the driver section B in the liquid crystal display device according to this embodiment. This liquid crystal display device shown in FIG. 7 is constructed such that a liquid crystal 220 is sandwiched between an array substrate 1 and a counter substrate 2.

In the pixel section of the array substrate 1, the pixel TFT 10 is formed on the surface of glass substrate 100. This pixel TFT 10 comprises a semiconductor layer 50 which is formed on the glass substrate 100 with an under-coat layer 110 being interposed therebetween. This semiconductor layer 50 is provided with a drain region 121 and source region 125, both of which are implanted with a high concentration of n-type impurity ion, e.g. phosphorus in this case, with LDD (Lightly Doped Drain) regions 122 and 124, both of which are implanted with a low concentration of n-type impurity ion, and a channel region 123 which is sandwiched between these LDD regions 122 and 124.

The pixel TFT 10 is constituted by a gate insulating film 140 covering the semiconductor layer 50 and designed to become a dielectric layer, a gate electrode 151 formed on this gate insulating film 140, an interlayer insulating film 160 covering the gate electrode 151, a drain electrode 171 formed on this interlayer insulating film 160 and connected with the drain region 121, and a source electrode 172 connected with the source region 125.

Further, a protective insulating film 180 is formed so as to cover the pixel TFT 10, and a transparent organic insulating film 190 is formed on this protective insulating film 180. A pixel electrode 200 is formed on this organic insulating film 190 and is connected, via a contact hole, with the source electrode 172. Furthermore, an alignment film 210 is formed on the pixel electrode 200.

The semiconductor layer 126 for the auxiliary capacity is formed at a region which is to be employed for the auxiliary capacity and located at the same level (the same plane) as that of the semiconductor layer 50. A dielectric layer consisting of the gate insulating film 140 is formed on this semiconductor layer 120, and an auxiliary capacity metal layer 152, which is integrally formed with an auxiliary capacity line 70, is formed on this dielectric layer. The semiconductor 126 layer for auxiliary capacity is entirely implanted with a high concentration of n-type impurity ion. For example, the same concentration of n-type impurity as that of the drain region 121 and source region 125 of the pixel TFT 10, or as that of the drain region 127 and source region 129 of the p-type driving circuit TFT 90 is implanted therein.

In this embodiment, since the pixel TFT is formed of an n-type TFT, the same concentration of n-type impurity as that of the drain region and source region of the pixel TFT 10 and the n-type driving circuit TFT, and the semiconductor layer for auxiliary capacity of the driving circuit section is implanted therein. And, phosphorus as an n-type impurity is implanted in the semiconductor layer 126 for the auxiliary capacity at a concentration of $3.2 \times 10^{19}$ to $2 \times 10^{20}$ atoms/$cm^3$. The source electrode 172 is connected, via an opening formed in the auxiliary capacity line 70, with the semiconductor layer 126 for auxiliary capacity.

In this manner, the semiconductor layer 126 for auxiliary capacity becomes the same electric potential level as that of the pixel electrode 200, and the gate insulating film 140 as a dielectric layer is sandwiched between the semiconductor layer 126 for auxiliary capacity and the auxiliary capacity metal layer 152, thereby constituting the auxiliary capacity.

By the way, the n-type driving circuit TFT 80 to be formed at the driver section B is constructed in the same manner as that of the pixel TFT 10 and provided with a semiconductor layer 50N, which is provided with a drain region 130, a source region 134, LDD regions 131 and 133, and a channel region 132. Thus, the n-type driving circuit TFT 80 is constituted by these regions and also by a gate electrode 155, a drain electrode 176 and a source electrode 177.

Further, the semiconductor layer 50P of p-type driving circuit TFT 90 is provided with a drain region 127 and a source region 129, both of which being doped with a high concentration of p-type impurity, e.g. boron in this embodiment. The channel region 128 is also doped with an impurity at the same concentration as that of the channel region 123 of pixel TFT 10. Thus, the p-type driving circuit TFT 90 is constituted by these regions and also by a gate electrode 154, a drain electrode 174 and a source electrode 175. By the way, this p-type driving circuit TFT 90 does not include the LDD region.

The counter substrate 2 is provided with a glass substrate 300, on which a color layer 310 is formed. Further, a counter electrode 320 and an alignment film 330 are formed on this color layer 310. A liquid crystal 220 is interposed between the array substrate 1 and the counter substrate 2.

Next, the method of manufacturing the liquid crystal display device according to this embodiment will be explained with reference to FIGS. 8A to 8G. This manufacturing method of the liquid crystal display device according to this embodiment is featured in that the particular order of steps is employed, thereby injecting an n-type or p-type impurity of high concentration into the semiconductor layer 126 for auxiliary capacity.

Figure 8A:
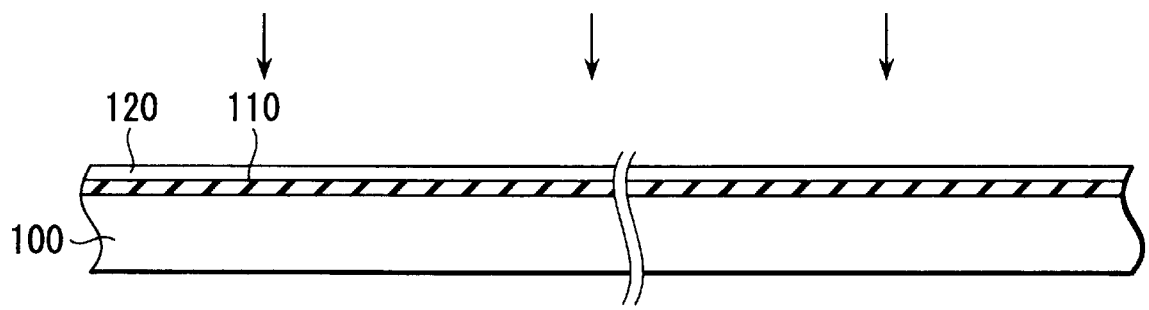

First of all, the array substrate 1 is manufactured as follows. Namely, as shown in FIG. 8A, an under-coat layer 110 consisting of a silicon oxide film having a thickness of 100 nm and an amorphous silicon thin film 120 having a thickness of 50 nm are successively deposited on a glass substrate by means of plasma CVD (Chemical Vapor Deposition). Then, by making use of $B_2H_6/H_2$ as a source gas, a low concentration of boron is injected into the amorphous silicon thin film 120 by means of ion doping method. In this case, the accelerated voltage is set to 10 keV, and the dosage is set to $4 \times 10^{11}$ atoms/cm$^2$.

Figure 8B:
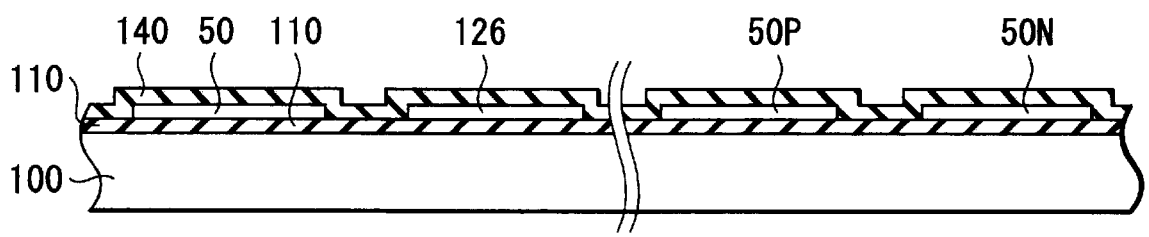
Figure 8C:
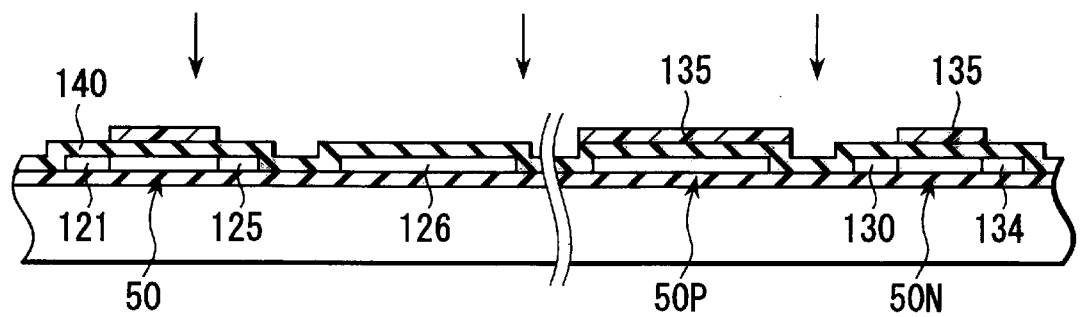

Then, the amorphous silicon thin film 120 is polycrystallized by means of ELA (excimer laser annealing) method, and is etched into a pattern of island by way of a photolithographic process. Thereafter, as shown in FIG. 8B, semiconductor layers 50, 50P and 50N, representing the pixel TFT 10, the p-type driving circuit TFT 90 and the n-type driving circuit TFT 80, respectively, are formed concurrent with the formation of the semiconductor layer 126 for auxiliary capacity. Subsequently, a gate insulating film 140 having a thickness of 140 nm and consisting of silicon oxide is deposited all over the resultant surface by means of plasma CVD method.

Then, as shown in FIG. 5C, a mask 135 consisting of a resist film is formed on the surface of the gate insulating film 140. This mask 135 is patterned into a configuration exposing the entire surfaces of the drain regions 121 and 130, of the source regions 125 and 134, and of the semiconductor layer 126 for auxiliary capacity, while covering the entire surface of the semiconductor layer 50 of the p-type driving circuit TFT 90.

Further, the thickness of the mask is 1.4 μm, and a hydrogen concentration in the gate insulating film and the semiconductor layer is controlled to be $3.2 \times 10^{20}$ atoms/cm$^3$.

Then, by making use of $PH_3/H_2$ as a source gas, a high concentration of phosphorus is injected through the mask 135 under the conditions of: 70 keV in accelerated voltage, and $2 \times 10^{15}$ atoms/cm$^2$ in dosage, thereby implanting a high concentration of phosphorus into the entire surface region of the semiconductor layer 126 for auxiliary capacity. Thus, under this ion implantation condition, the concentration of phosphorus to be implanted is controlled to the range of $3.2 \times 10^{19}$ to $2.0 \times 10^{20}$ atoms/cm$^3$.

Figure 8D:
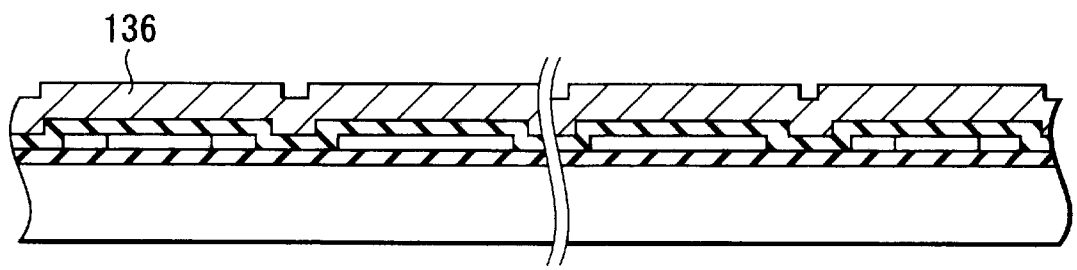

After the removal of the mask, an MoW alloy layer 136 having a thickness of 300 nm is deposited on the gate insulating film 140 as shown in FIG. 8D by means of sputtering method.

Figure 8E:
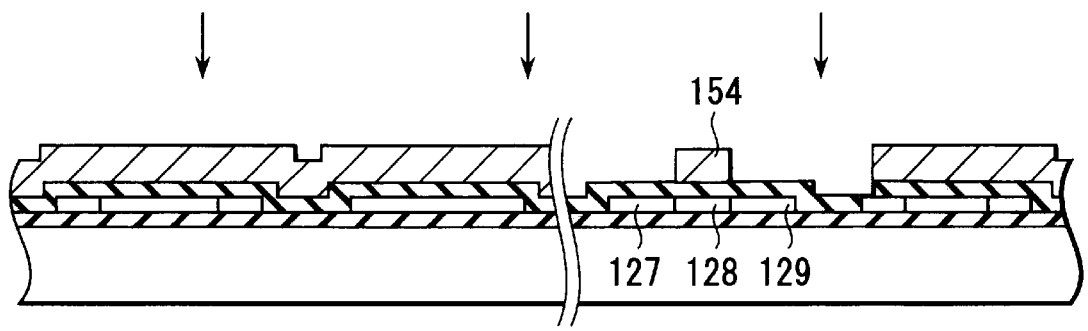
Figure 8D:
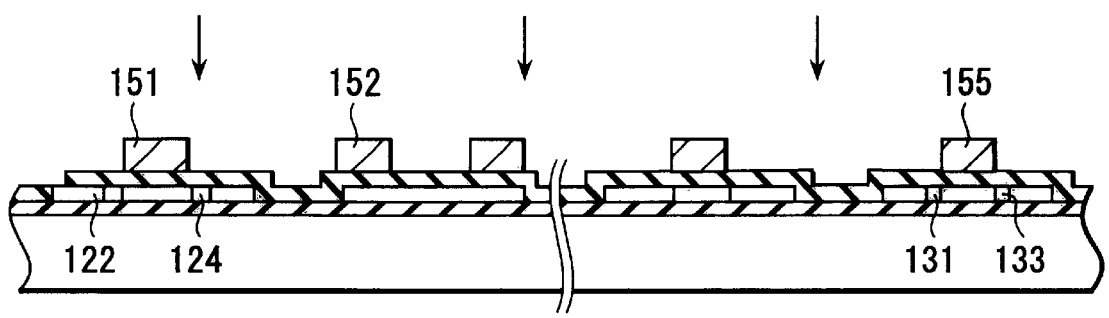

Thereafter, the MoW alloy layer 136 is patterned into a predetermined configuration by means of photolithography so as to form a gate electrode 154 on a region to be subsequently turned into the channel region 128 of the p-type driving circuit TFT 90. Then, by making use of this gate electrode 154 as a mask, and by making use of $B_2H_6/H_2$ as a source gas, a high concentration of boron is injected into the semiconductor layer 50P under the conditions of: 80 keV in accelerated voltage and $2 \times 10^{15}$ atoms/cm$^2$ in dosage, thereby forming the drain region 127 and the source region 129 of the p-type driving circuit TFT 90 (FIG. 8E).

Then, the MoW alloy layer is patterned into a predetermined configuration to thereby form the gate electrode 151 of the pixel TFT 10, the gate electrode 155 of the n-type driving circuit TFT 80, and the auxiliary capacity line 152. By the way, the contact hole is formed concurrent with the formation of this auxiliary capacity line 152.

Subsequently, by making use of not only the gate electrode 151 of the pixel TFT 10 but also the gate electrode 155 of the n-type driving circuit TFT 80, a low concentration of phosphorus (P) is injected into the semiconductor layers 50 and 50N by making use of $PH_3/H_2$ as a source gas and under the conditions of: 80 keV in accelerated voltage and $2 \times 10^{13}$ atoms/cm$^2$ in dosage, thereby forming the LDDs 122 and 124, and the LDD regions 131 and 133 of the n-type driving circuit TFT 80 (FIG. 8F).

Further, the impurity is activated by heat treatment in an atmosphere of $N_2$ at a temperature of 500° C. for 1 hour and a carrier concentration is controlled to be $2.5 \times 10^{19}$ atoms/cm$^3$.

Then, an interlayer insulating film 160 having a thickness of 600 nm and consisting of silicon oxide is deposited by means of plasma CVD method. Thereafter, contact holes each corresponding to the drain region 121 and source region 125 of the pixel TFT 10, to the semiconductor layer 126 for auxiliary capacity, to the drain region 127 and source region 129 of the p-type driving circuit TFT 90, and to the drain region 130 and source region 134 of the n-type driving circuit TFT 80 are formed, respectively. Then, a simple substance of Al, etc., a laminate body thereof or an alloy film is deposited on the resultant surface to form a conductive layer which is then patterned to form the drain electrode 171 and source electrode 172 of the pixel TFT 10, the drain electrode 174 and source electrode 175 of the p-type driving circuit TFT 90, and the drain electrode 176 and source electrode 177 of the n-type driving circuit TFT 80.

Further, a protective insulating film 180 consisting of silicon nitride is deposited by means of plasma CVD method, and a contact hole extending to reach the source electrode 172 of the pixel TFT 10 is formed. Thereafter, a transparent organic insulating film 190 having a thickness of 2 μm is deposited, and a contact hole also extending to reach the source electrode 172 of the pixel TFT 10 is formed.

Then, an ITO (Indium Tin Oxide) film having a thickness of 100 nm is deposited by means of sputtering method and subsequently patterned into a predetermined configuration to thereby form a pixel electrode 200.

Figure 8G:
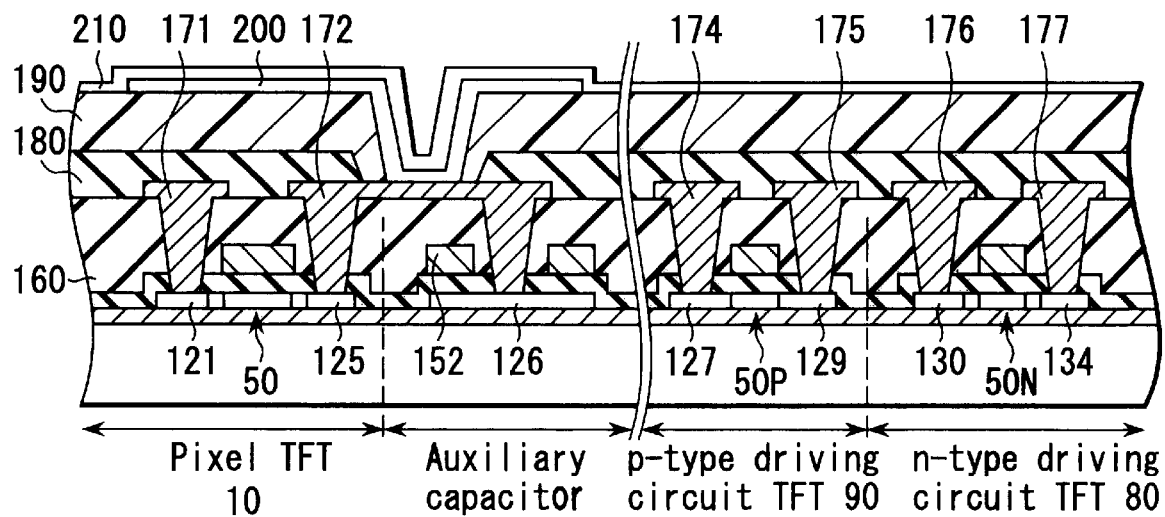

Finally, a low temperature cure type polyimide is printed and then, subjected to rubbing treatment to thereby form an alignment film 210, thus obtaining the array substrate 1 as shown in FIG. 8G.

On the other hand, the counter substrate 2 can be manufactured as follows. First of all, three kinds of color layers 310 representing red, green and blue and having predetermined kinds of pigment dispersed therein are deposited in a stripe pattern on a glass substrate.

Then, an ITO film having a thickness of 100 nm is deposited by means of sputtering method to thereby form a counter electrode 320.

Then, a polyimide is printed over the counter electrode 320 and subjected to rubbing treatment to thereby form an alignment film 330, thus obtaining the counter substrate 2.

The array substrate 1 and the counter substrate 2 which are manufactured as described above are disposed in a manner where the alignment films 210 and 330 are faced to each other, under which condition they are adhered to each other by making use of a sealing member (not shown). Since this sealing member is provided with a liquid crystal inlet port, the liquid crystal 220 could be introduced through this inlet port into the device by means of vacuum injection method. Subsequently, the inlet port is sealed using a sealing material to obtain a liquid crystal display device as shown in FIG. 7.

According to the liquid crystal display device obtained by the aforementioned manufacturing method, the auxiliary capacity of MOS structure where the gate insulating film 140 functioning as a dielectric layer is sandwiched between the semiconductor layer 126 for auxiliary capacity and the auxiliary capacity metal layer 152 is fabricated such that the concentration of impurity ion to be injected into the semiconductor layer 126 for auxiliary capacity is made almost the identical with that of the drain regions 121 and 130 and source regions 125 and 134 of the pixel TFT 10 and n-type driving circuit TFT 80, and can be controlled in this embodiment to of $5 \times 10^{19}$ atoms/cm$^3$. In the followings, this range of concentration of impurity ion will be discussed.

Figure 9:
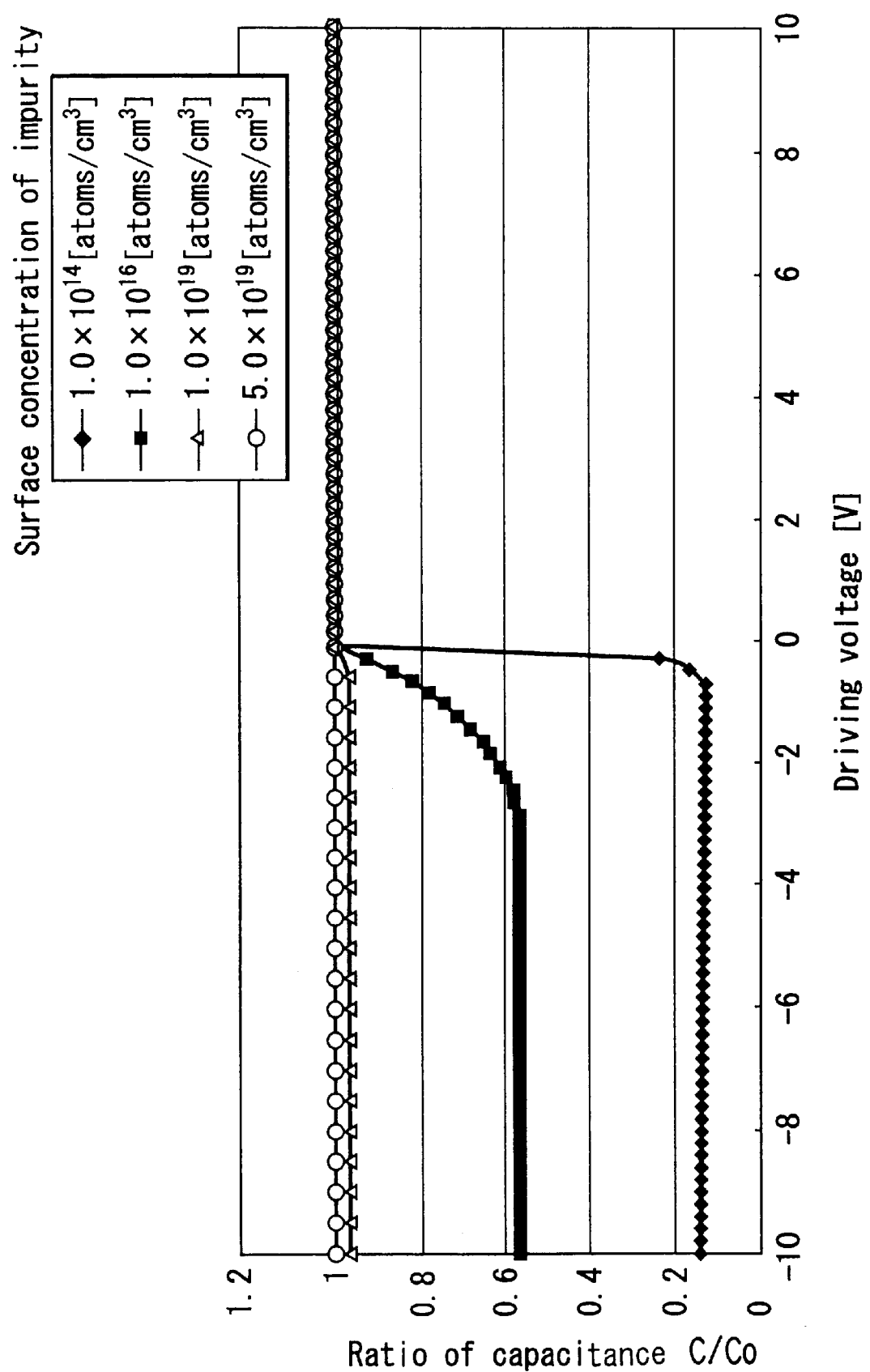
FIG. 9 is a graph illustrating the C-V characteristics of the auxiliary capacity as the concentration of impurity ion to be injected into the semiconductor layer for auxiliary capacity is fluctuated.

FIG. 9 shows the C-V characteristics of the auxiliary capacity wherein the concentration of impurity ion to be injected into the semiconductor layer 126 for auxiliary capacity was changed. The abscissa in FIG. 9 denotes the driving voltage. The ordinate in FIG. 9 denotes the ratio of C/Co wherein Co represents the capacity of dielectric layer, and C represents the auxiliary capacity. In this case, Co is a constant, and the maximum value of C/Co is 1.

As shown in FIG. 9, when the concentration of impurity ion to be injected was confined to $1 \times 10^{14}$ atoms/cm$^3$, the capacity was relatively low as the driving voltage was lowered, and the fluctuation of capacity became prominent as the driving voltage was altered. Whereas, when the concentration of impurity ion to be injected was increased to $1 \times 10^{16}$ atoms/cm$^3$, the capacity was slightly increased when the driving voltage was relatively low. Further, when the concentration of impurity ion to be injected was further increased up to order of $10^{19}$ atoms/cm$^3$, the capacity was further increased when the driving voltage was relatively low, and the fluctuation of capacity as the driving voltage was altered was minimized. This phenomenon can be attributed to the fact that as the concentration of impurity ion is increased, the depletion of the semiconductor layer can be proportionally inhibited.

As explained above, the voltage dependency of the auxiliary capacity can be effectively minimized by injecting a high concentration of impurity, in this case n-type impurity, into the semiconductor layer 126 for auxiliary capacity. As a result, it becomes possible to lower the driving voltage of the liquid crystal display device.

Figure 10:
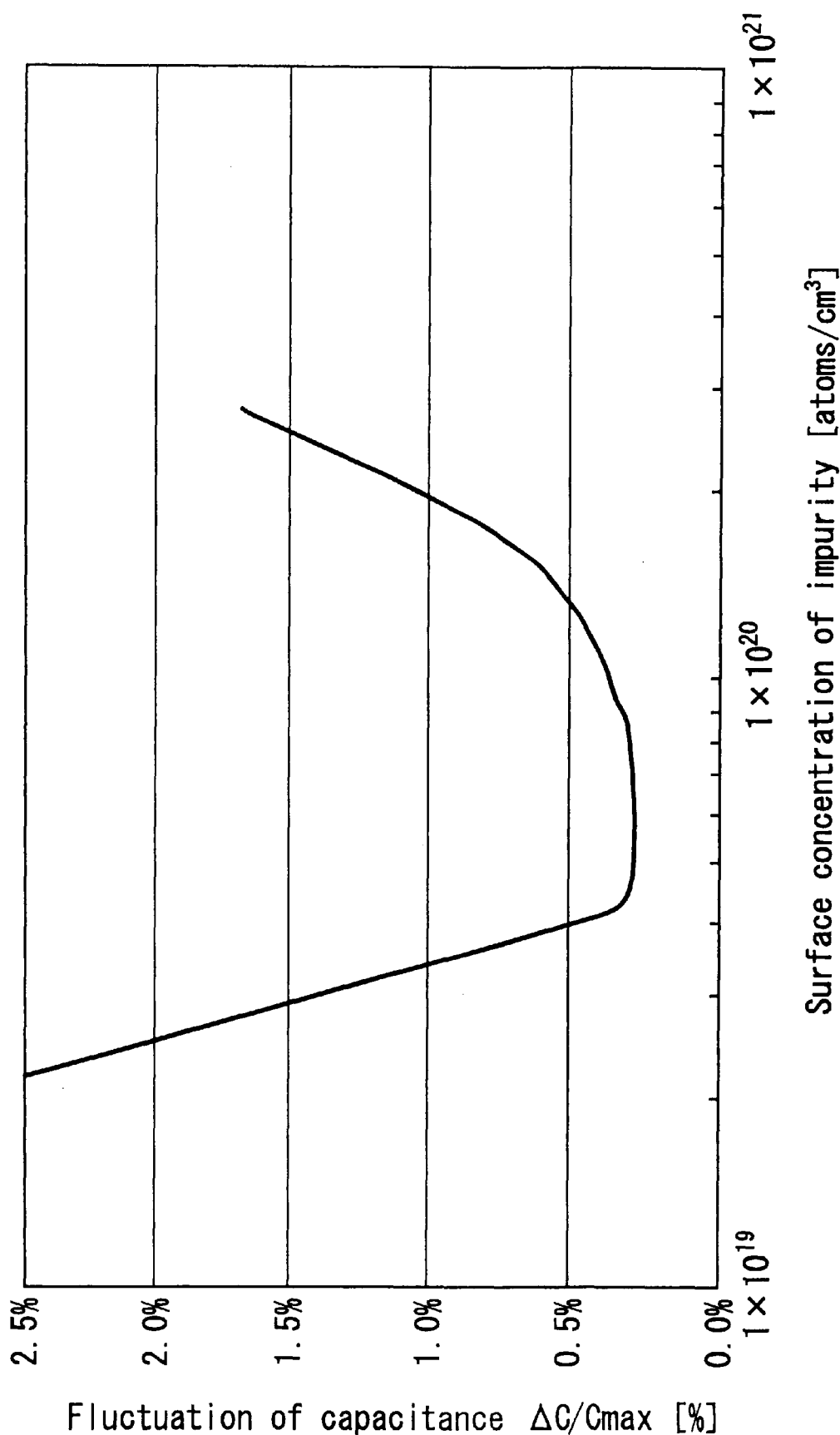
FIG. 10 is a graph illustrating the fluctuation ratio of the auxiliary capacity as measured relative to the concentration of impurity in the semiconductor layer for auxiliary capacity is fluctuated.

Next, a preferable range of the concentration of impurity ion in the semiconductor layer 126 for auxiliary capacity will be further discussed in detail. FIG. 10 is a graph showing the ratio of changes in auxiliary capacity $\Delta C/C_{max}$ which was measured under the conditions wherein the voltage $V_{sig}$ to be applied to the semiconductor layer 126 for auxiliary capacity was set to 1 to 9V, the voltage to be applied to the auxiliary capacity line 70 was set to 5V, and the driving voltage $V_{sig}$-$V_{cs}$ was set to −4V to 4V by making use of various kinds of liquid crystal display device which are manufactured by variously changing the concentration of n-type impurity ion to be injected into the semiconductor layer 126 for auxiliary capacity. In order to normally maintain the display performance of liquid crystal display device, the ratio of changes in auxiliary capacity $\Delta C/C_{max}$ is required to be confined to not more than 1% as explained above. This requirement can be satisfied by increasing the concentration of n-type impurity ion up to as high as $3.2 \times 10^{19}$ to $2.0 \times 10^{20}$ atoms/cm$^3$.

As explained above, when the concentration of impurity ion to be injected into the semiconductor layer 126 for auxiliary capacity is increased to a high level, preferably in the range of $3.2 \times 10^{19}$ to $2.0 \times 10^{20}$ atoms/cm$^3$ in a flat panel display device provided with an auxiliary capacity where the dielectric layer thereof is sandwiched between the semiconductor layer and the metal layer, the voltage dependency of the auxiliary capacity can be effectively minimized, and the driving voltage of the flat panel display device can be greatly reduced. By the way, the concentration of impurity ion injected into the semiconductor layer 126 for auxiliary capacity can be defined as being high if the concentration of impurity ion injected into the semiconductor layer 126 for auxiliary capacity is almost the identical with the concentration of impurity ion in the source/drain regions of TFT to be formed simultaneous with the implantation of impurity in the semiconductor layer 126 for auxiliary capacity.

According to the flat panel display device of this embodiment, the semiconductor layer 126 for auxiliary capacity was doped with phosphorus so as to obtain a concentration ranging from $3.2 \times 10^{19}$ to $2.0 \times 10^{20}$ atoms/cm$^3$, thereby increasing the carrier concentration to $1.6 \times 10^{19}$ atoms/cm$^3$ or more, and making it possible to inhibit the leak current that may be generated in the case of the conventional liquid crystal display device and to improve the quality and reliability of the flat panel display device.

According to the flat panel display device of the present embodiment, it was possible, in this manner, to reduce the number of point defect to about a half as compared with that of the conventional flat panel display device.

Further, although the semiconductor layer 50 of the pixel TFT 10 is completely separated from the semiconductor layer 126 for auxiliary capacity of the pixel section in this embodiment, they may be formed contiguous with each other.

Furthermore, the expression of the entire surface of semiconductor layer for the auxiliary capacity should be understood to indicate the region where the it is overlapped with the auxiliary capacity metal layer, so that the region which is not overlapped with the auxiliary capacity metal layer is not necessarily required to be injected with an n-type impurity ion.

Although a liquid crystal display device is exemplified in the foregoing embodiments, the present invention can be applied to a general flat panel display device which is provided with an auxiliary capacity having a structure wherein a dielectric layer is sandwiched between the semiconductor layer and the metal layer. For example, the present invention can be applied to a display device employing electroluminescent (EL) for instance.

Next, the liquid crystal display device according to a second embodiment belonging to the second aspect of the present invention will be explained.

Figure 11A:
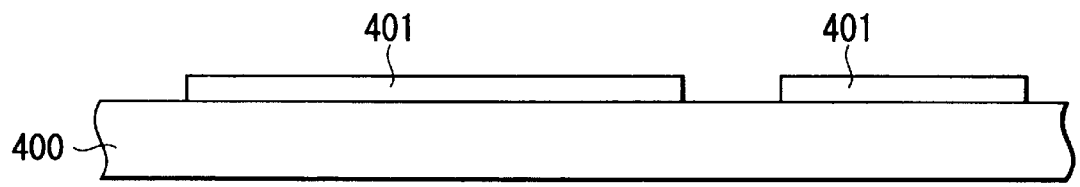
FIGS. 11A to 11E respectively shows a cross-sectional view illustrating sequentially the manufacturing step of the driving circuit substrate of liquid crystal display device according to a second aspect of the present invention.

FIGS. 11A to 11E respectively shows a cross-sectional view illustrating the manufacturing steps of the driving circuit of the liquid crystal display device according to the second embodiment. As shown in FIG. 11A, an amorphous silicon thin film 401 to be employed as an active layer is deposited to a thickness of 50 nm on an insulating substrate 400 made of glass, etc. by means of plasma CVD method. Then, this amorphous silicon thin film 401 is heated and crystallized by making use of excimer laser for instance to thereby obtain a polycrystalline silicon thin film 401. Then, this polycrystalline silicon thin film 401 is worked into an island pattern by means of photolithographic method.

Figure 11B:
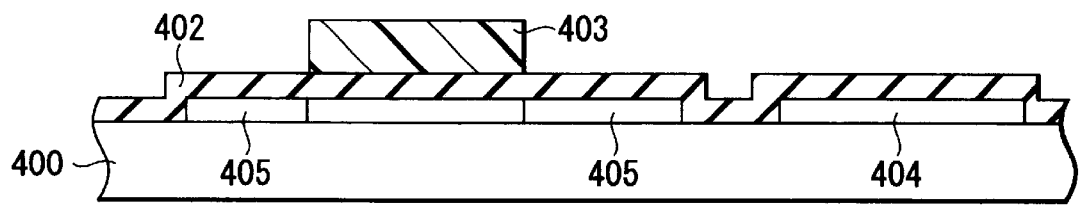

Then, as shown in FIG. 11B, a silicon oxide film 402 to be employed as a gate insulating film is deposited to a thickness of 100 nm all over the surface by means of plasma CVD method. Thereafter, a photosensitive resin layer 403 is selectively formed for the purpose of selectively forming a lower electrode of a capacitor as well as selectively forming the source/drain regions of transistor.

Next, by making use of the photo-sensitive resin layer 403 as a mask, an n-type impurity such as phosphorus is injected so as to form the lower electrode 404 of capacitor and the source/drain diffusion region 405.

Thereafter, the redundant photo-sensitive resin layer 403 is removed by means of plasma ashing method. On this occasion, if the power of plasma is excessively high or the ashing time is excessively long, the Si—H bond existing inside the silicon oxide film 402 located below would be caused to cut-off, thereby causing the fluctuation of the characteristics (threshold value) of transistor. For the purpose of preventing this problem, an upper limit should be predetermined with respect to the power of plasma and to ashing time so as to control the number of defects (the number of unpaired electrons) in the gate insulating film.

Figure 12:
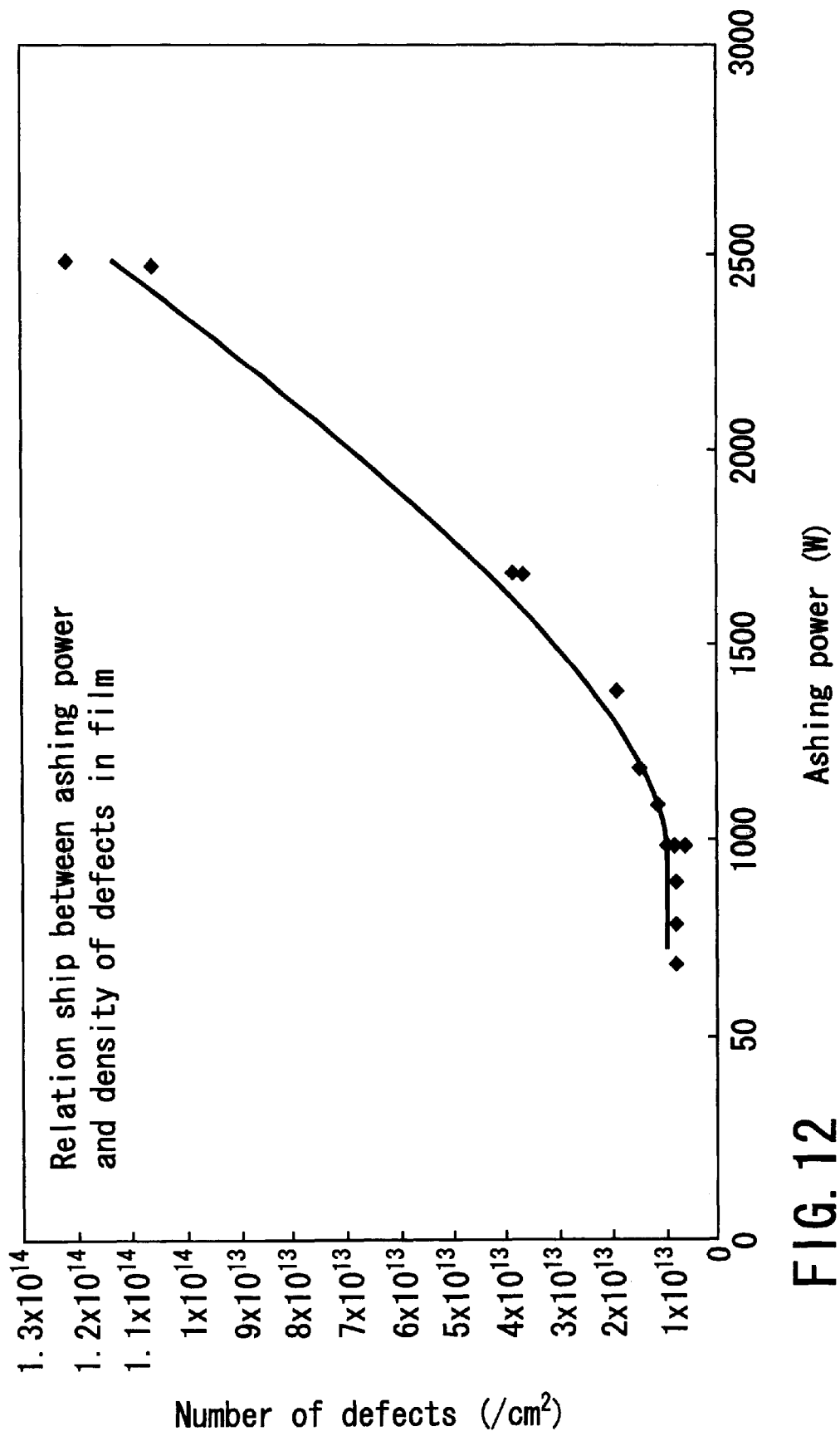
FIG. 12 is a graph illustrating the relationship between the ashing power and the density of defect in a film.

As shown in FIG. 12, if the power of plasma exceeds over 1000W, the number of defects would be increased. Therefore, the power of plasma should preferably be confined to not more than 1000W. For example, when the ashing treatment is performed for a total time of 200 seconds with a plasma output of 1000W, the number of defects (the number of unpaired electrons) can be limited to not more than $1.1 \times 10^{13}/cm^2$.

The time for the ashing treatment is set such that the just ashing is defined as being 100%, and then an over-ashing treatment is further continued so to make it 200% in total. The over-ashing treatment is performed in such a manner that the photosensitive resin is enabled to be peeled within the plane of substrate, and hence, it is generally preset lower than that of the just etching treatment.

Figure 11C:
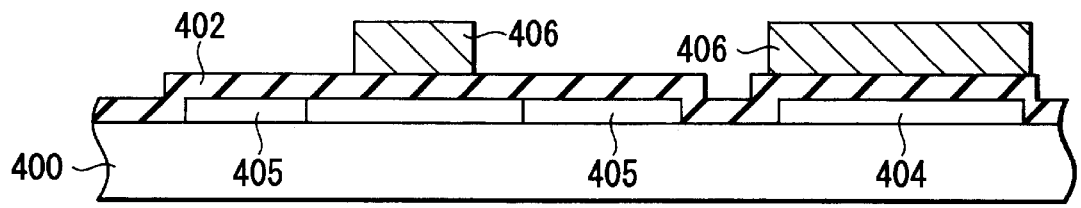
Figure 11D:
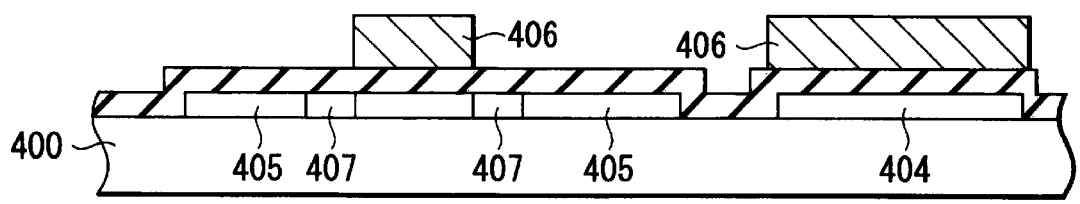

Next, as shown in FIG. 11C, a metal thin film is deposited to a thickness of 300 nm by means of sputtering method, and the redundant portion thereof other than requisite portions such as the gate wiring portion is removed by means of photolithographic method, thereby forming a gate electrode 406. Thereafter, by making this gate electrode 406 as a mask, a low concentration of n-type impurity such as phosphorus is injected into the polycrystalline silicon thin film 401 in a self-alignment manner so as to form LDD (Lightly Doped Drain) region 407 as shown in FIG. 1D, this LDD region 407 being subsequently activated by means of heat-treatment.

Then, a silicon oxide film 408 to be employed as an interlayer insulating film is formed by means of plasma CVD method. Further, an ITO film 409 for constituting a pixel electrode is deposited to a thickness of 100 nm by means of sputtering method, the redundant portion the ITO film 409 being subsequently removed by means of photolithographic method. Then, by means of photolithographic method, the openings for the source/drain regions are formed.

Subsequently, an aluminum thin film or an aluminum alloy thin film 410 for forming the source/drain electrodes and the signal wiring is formed to a thickness of 400 nm by means of sputtering method, the redundant portion the thin film 410 being subsequently removed by means of photolithographic method to thereby accomplish the formation of wirings.

Figure 11E:
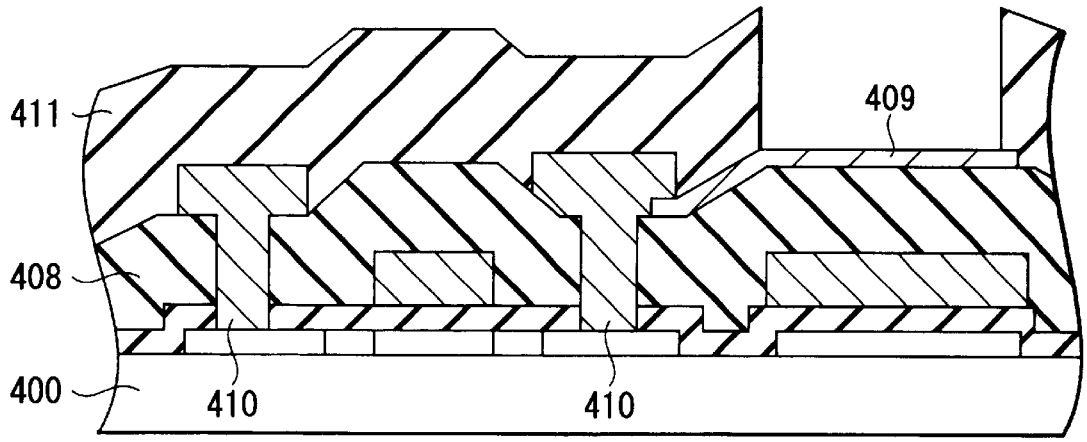

Additionally, a silicon nitride film 411 to be employed as a passivation film is deposited to a thickness of 400 nm over the wirings, the redundant portion the silicon nitride film 411 being subsequently removed by means of photolithographic method to thereby accomplish a thin film semiconductor device for driving the liquid crystal cell as shown in FIG. 11E.

According to this embodiment explained above, the polycrystalline silicon thin film functioning as an active layer of thin film semiconductor device is formed by means of laser annealing method. However, the active layer may be formed by way of the solid phase growth of amorphous silicon. Further, although a metal thin film which is deposited by means of sputtering method is employed for forming the gate electrode, the gate electrode may be formed by making use of a p-type impurity-doped silicon thin film. Further, this embodiment is explained by referring, as one example, to an n-type semiconductor device where phosphorus is employed as an impurity to be implanted. However, the present invention is also applicable to a p-type semiconductor device in the same manner as in the first embodiment.

Further, though, in the present embodiment, the driving circuit section is shown and described, the thin film transistors in the pixel section and driving circuit section are produced in the same step in the same manner as in the first embodiment.

Furthermore, the step of removing the photosensitive resin layer in the present embodiment is the same as the step of removing the mask 135 in the first embodiment.

Furthermore, although an oxide film which is formed by means of plasma CVD method is employed as an interlayer insulating film in this embodiment, the oxide film may be formed by means of thermal CVD method or by means of sputtering method. Further, the interlayer insulating film may not be formed of an oxide film but may be formed of any kind of film as long as the film is provided with a sufficient insulating property. Although an aluminum thin film or an aluminum alloy thin film is employed as a signal electrode (source electrode) in this embodiment, the signal electrode may be constituted by any kind of substance as long as it is an electrically conductive material.

In the present embodiment, described is the array substrate in which the pixel electrode 409 and the source electrode 410 are formed on the same plane as one example. The present invention, however, is not limited to this.

Next, a third embodiment of the present invention will be explained.

This third embodiment is featured in that it belongs to the first aspect of the present invention and illustrates one example wherein the concentration of hydrogen in the gate insulating film and in the semiconductor layer is controlled to not more than $1 \times 10^{21}$ (atoms/cm$^3$).

Figure 13:
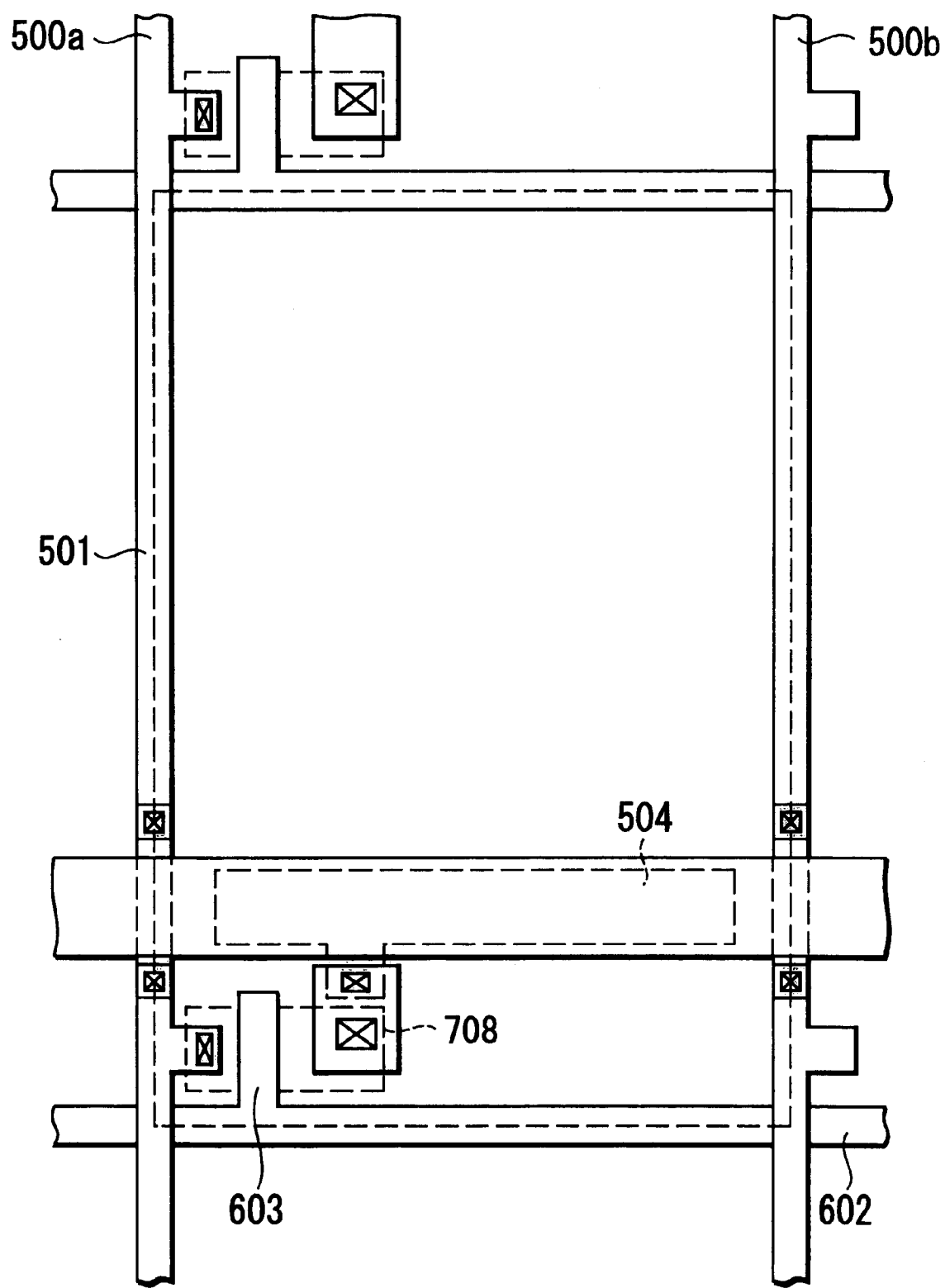
FIG. 13 is a plan view illustrating the liquid crystal display device according to a third aspect of the present invention.
Figure 14:
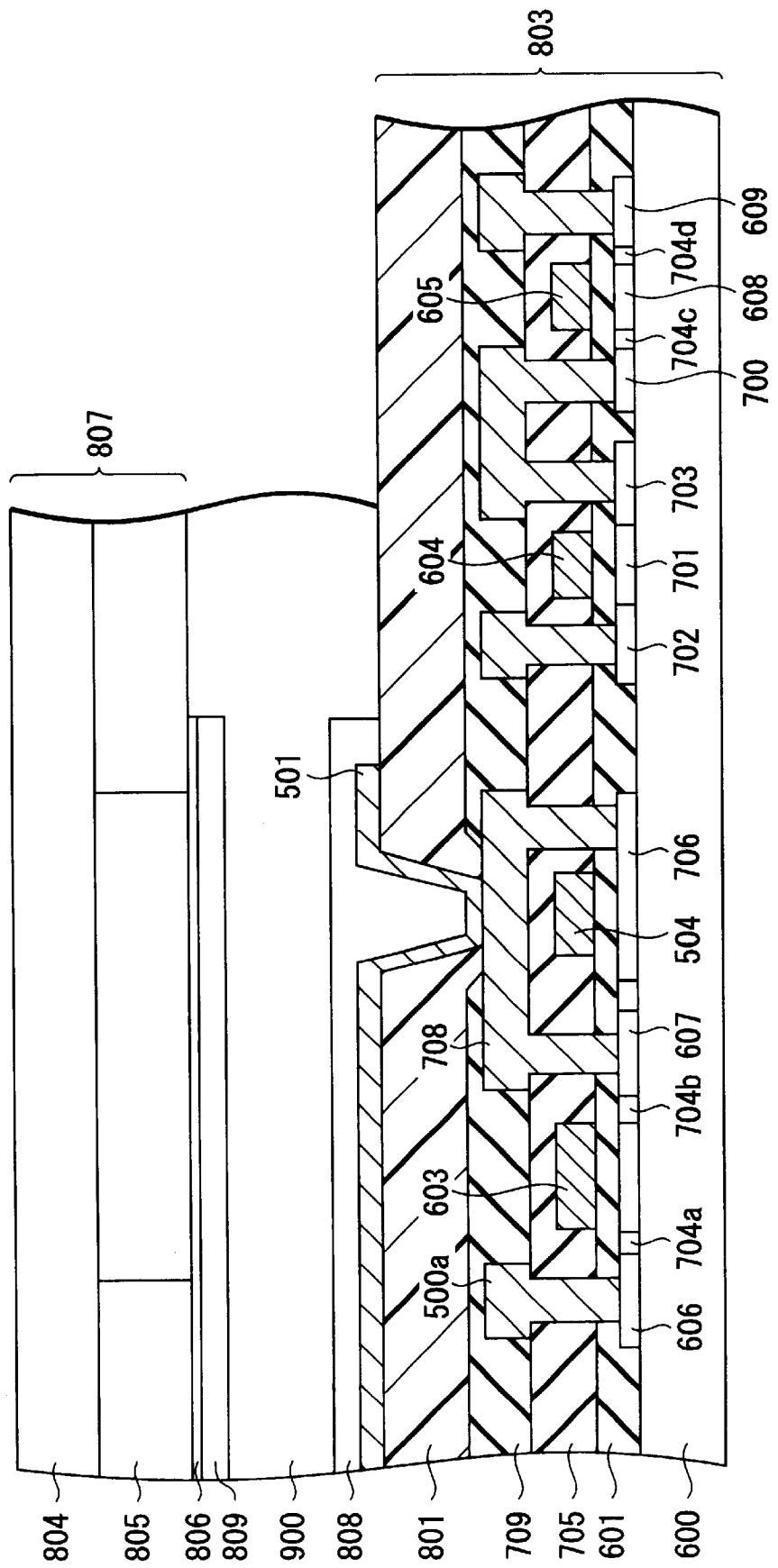
FIG. 14 is a cross-sectional view taken along the line E-F-G of FIG. 13.

FIG. 13 shows a partially enlarged plan view of an array substrate of an active matrix type liquid crystal display device according to this embodiment. FIG. 14 is a cross-sectional view of the active matrix type liquid crystal display device.

Followings are explanations on the method of manufacturing the active matrix type liquid crystal display device according to the present embodiment which is illustrated with reference to FIG. 14.

First of all, an amorphous silicon thin film to be employed as an active layer is deposited to a thickness of about 50 nm on an insulating substrate 600 by means of PECVD (Plasma Chemical Vapor Deposition) method.

On this occasion, a low concentration of boron is injected into the silicon thin film by making use of $B_2H_6/H_2$ as a source gas and by means of ion doping method under the conditions of: 10 keV in accelerating voltage and $4\times10^{11}$ (atoms/cm$^2$) in dosage.

Then, the amorphous silicon thin film is polycrystallized by means of ELA (excimer laser annealing) method, and is etched into a pattern of island by way of photolithographic process.

Thereafter, an $SiO_X$ film 601 to be employed as a gate insulating film and also as the dielectric layer of auxiliary capacity is deposited all over the surface to a thickness of about 140 nm by means of AP (normal pressure) CVD method.

Then, by making use of a resist film having a predetermined pattern as a mask and also by making use of $PH_3/H_2$ as a source gas, a high concentration of phosphorus is injected through the mask into the polycrystalline silicon layer under the conditions of: 70 keV in accelerated voltage, and $2\times10^{15}$ atoms/cm$^2$ in dosage, thereby forming an auxiliary capacity semiconductor region 706, the drain region 606 and source region 607 of the pixel TFT, the drain region 609 and source region 700 of the n-type TFT constituting the driving circuit (hereinafter referred to as n-type circuit TFT). As a result, a high concentration of n-type impurity is injected into the semiconductor layer thereof. In this case, the thickness of the resist film is about 1.5 $\mu$m, so that the concentration of hydrogen to be implanted into the gate insulating film and into the polycrystalline silicon layer would become $1\times10^{21}$ (atoms/cm$^3$) or less, thereby making it possible to prevent the characteristics of TFT from being deteriorated in the same manner as in the case of the aforementioned second embodiment.

After the removal of the resist film, an MoW alloy film having a thickness of about 300 nm is deposited all over the surface of $SiO_x$ film 601 by means of sputtering method. Thereafter, by means of photolithography process, only a portion of the MoW alloy film which is located at the p-type TFT portion constituting the driving circuit (p-type driving circuit TFT) is patterned into a predetermined configuration, thereby forming the gate electrode 604 of the p-type driving circuit TFT.

Thereafter, by making use of this gate electrode 604 as a mask, and by making use of $B_2H_6/H_2$ as a source gas, a high concentration of boron is injected so as to form the source region 702 and drain region 703 of the p-type driving circuit TFT.

Further, a portion of the MoW alloy layer which is located at the pixel TFT region, the n-type driving circuit TFT region and the auxiliary capacity region is patterned into a predetermined configuration to thereby form the gate electrodes 603 and 605 of the pixel TFT and the n-type driving circuit TFT. Then, by making use of these gate electrodes 603 and 605 as a mask and also by making use of $PH_3/H_2$ as a source gas, a low concentration of phosphorus is injected under the conditions of: 80 keV in accelerated voltage, and $5\times10$ atoms$^{13}$/cm$^2$ in dosage, thereby forming the LDD regions 704a and 704d of the pixel TFT and the n-type driving circuit TFT, respectively.

Then, the MoW alloy layer is patterned into a predetermined configuration to thereby form a scanning line 602, the auxiliary capacity line 504, the gate electrode 603 of the pixel TFT, the gate electrodes 604 and 605 of the driving circuit TFT, and various wirings located within the region of the driving circuit.

Subsequently, by means of the PECVD method, $SiO_2$ film as an interlayer insulating film 705 is deposited all over the surface of substrate to a thickness of about 600 nm.

Thereafter, by means of photoetching method, a contact hole extending to reach the drain region 606 and source region 607 of the pixel TFT as well as a contact hole extending to reach the source regions 609 and 702 and drain regions 700 and 703 of the circuit TFT are formed.

Then, a simple substance of Al, etc., a laminate body thereof or an alloy film, each having a film thickness of 500 nm, is deposited on the resultant surface to form a conductive layer which is then patterned into a predetermined configuration by means of photoetching method, thereby forming signal lines 500a and 500b, a connecting line connecting the drain electrode 606 of the pixel TFT with the signal line 500a, a connecting line 708 connected to the source region 607, to the semiconductor layer of auxiliary capacity, and to the source region of pixel TFT, and various wirings of the driving circuit TFT located within the driving circuit region.

Further, a protective insulating film 709 consisting of $SiN_x$ is deposited all over the resultant surface by means of PECVD method, and a contact hole extending to reach the connecting line 708 formed between the semiconductor layer of auxiliary capacity and the source region of pixel TFT is formed by means of photoetching method.

Thereafter, an organic insulating film 801 having a thickness of about 2 $\mu$m is deposited all over the resultant surface, and a contact hole also extending to reach the connecting line 708 formed between the semiconductor layer of auxiliary capacity and the source region of pixel TFT is formed.

Finally, an ITO film having a thickness of about 100 nm is deposited by means of sputtering method and subsequently patterned into a predetermined configuration to thereby form a pixel electrode 501. Then, this pixel electrode 501 is connected with the connecting line 708 which has been formed between the semiconductor layer of auxiliary capacity and the source region of pixel TFT, thereby obtaining the array substrate 803 of the active matrix type array display element.

As explained above, since the doping of the semiconductor layer of auxiliary capacity of MOS structure with an n-type impurity is controlled in such a manner that the concentration of hydrogen to be injected into the gate insulating film and into the semiconductor layer is limited to not more than $1\times10^{21}$ (atoms/cm$^3$), it is now possible to control the density of defects (unpaired electron) to not more than $6.91\times10^{18}$ (atoms/cm$^3$), and to prevent the characteristics of TFT from being deteriorated.

On the other hand, the counter substrate 2 can be manufactured as follows. First of all, color layers 805 each having a pigment dispersed therein are formed, and then, a counter electrode 806 consisting of a transparent electrode made of ITO for instance is deposited thereon, thereby forming a counter substrate 807.

Thereafter, alignment films 808 and 809 both made of a low temperature cure type polyimide are printed all over the surface of the array substrate 803 where the pixel electrode 501 is disposed, and over the surface of the counter substrate 807 where the counter electrode 806 is disposed, respectively. Then, these alignment films 808 and 809 are subjected to rubbing treatment in such a manner that the axis of orientation of the array substrate 803 is intersected at an angle of 90° with the axis of orientation of the counter substrate 807 as these substrates 803 and 807 are disposed face to face. Thereafter, these substrates 803 and 807 are assembled face to face to thereby form a cell provided with a space, into which a nematic liquid crystal 900 is introduced. After finishing the sealing of the space, polarizing plates are attached to the insulating substrates 600 and 804 of these substrates 803 and 807, respectively, thus obtaining the active matrix type liquid crystal display device.

Next, a fourth embodiment of the present invention will be explained.

First of all, an amorphous silicon thin film to be employed as an active layer is deposited to a thickness of about 50 nm on an insulating substrate 600 by means of PECVD (Plasma Chemical Vapor Deposition) method.

On this occasion, a low concentration of boron is injected into the silicon thin film by making use of $B_2H_6/H_2$ as a source gas and by means of ion doping method under the conditions of: 10 keV in accelerating voltage and $4\times10^{11}$ (atoms/cm$^2$) in dosage.

Then, the amorphous silicon thin film is polycrystallized by means of ELA (excimer laser annealing) method, and is etched into a pattern of island by way of photolithographic process.

Thereafter, an $SiO_x$ film 601 to be employed as a gate insulating film and also as the dielectric layer of auxiliary capacity is deposited all over the surface to a thickness of about 80 nm by means of AP (normal pressure) CVD method.

Then, by making use of a resist film having a predetermined pattern as a mask and also by making use of $PH_3/H_2$ as a source gas, a high concentration of phosphorus is injected through the mask into the polycrystalline silicon layer under the conditions of: 50 keV in accelerated voltage, and $1.5\times10^{15}$ atoms/cm$^2$ in dosage, thereby forming an auxiliary capacity semiconductor region 706, the drain region 606 and source region 607 of the pixel TFT, the drain region 609 and source region 700 of the n-type TFT constituting the driving circuit (hereinafter referred to as n-type circuit TFT). As a result, a high concentration of n-type impurity is injected into the semiconductor layer thereof. In this case, the thickness of the resist film is about 1.5 μm, so that the concentration of hydrogen to be implanted into the gate insulating film and into the polycrystalline silicon layer would become $1\times10^{21}$ (atoms/cm$^3$) or less, thereby making it possible to prevent the characteristics of TFT from being deteriorated in the same manner as in the case of the aforementioned third embodiment.

After the removal of the resist film, an MoW alloy film having a thickness of about 300 nm is deposited all over the surface of $SiO_x$ film 601 by means of sputtering method. Thereafter, by means of photolithography process, only a portion of the MoW alloy film which is located at the p-type TFT portion constituting the driving circuit (p-type driving circuit TFT) is patterned into a predetermined configuration, thereby forming the gate electrode 604 of the p-type driving circuit TFT.

This resist removing step is carried out by a plasma ashing method in the same manner as in the second embodiment, and the power, time and the like are properly controlled so that the number of the defects in the gate insulating film would become $1.1\times10^{13}$ (atoms/cm$^2$).

Thereafter, by making use of this gate electrode 604 as a mask, and by making use of $B_2H_6/H_2$ as a source gas, a high concentration of boron is injected under the conditions of: 45 keV in accelerated voltage, and $1\times10$ atoms$^{13}$/cm$^2$ in dosage, so as to form the source region 702 and drain region 703 of the p-type driving circuit TFT.

Further, a portion of the MoW alloy layer which is located at the pixel TFT region, the n-type driving circuit TFT region and the auxiliary capacity region is patterned into a predetermined configuration to thereby form the gate electrodes 603 and 605 of the pixel TFT and the n-type driving circuit TFT. Then, by making use of these gate electrodes 603 and 605 as a mask and also by making use of $PH_3/H_2$ as a source gas, a low concentration of phosphorus is injected under the conditions of: 50 keV in accelerated voltage, and $3.5\times10$ atoms$^{13}$/cm$^2$ in dosage, thereby forming the LDD regions 704a and 704d of the pixel TFT and the n-type driving circuit TFT, respectively.

Further, the impurity is activated by heat treatment in an atmosphere of $N_2$ at a temperature of 500° C. for 1 hour and a carrier concentration is controlled to be $2.5\times10^{19}$ atoms/cm$^3$.

The subsequent steps are carried out in the same manner as in the third embodiment.

Thus, in the present invention, it is possible to set the surface concentration of an n-type impurity in the semiconductor layer for the auxiliary capacity to $5\times10^{19}$ atoms/cm$^3$, and t set the carrier concentration to $2.5\times10^{19}$ atoms/cm$^3$.

According to the present invention, even if the auxiliary capacity is formed of MOS structure where the semiconductor layer thereof is doped with a high concentration of impurity ion, it is possible to prevent the characteristics of TFT from being deteriorated. As a result, it is possible to realize a liquid crystal exhibiting a display of high quality and having an excellent reliability.

Although the above embodiments have been explained with reference to a liquid crystal display device, the present invention would not be limited to them, but is applicable to every kinds of flat panel display device employing an array substrate. For example, the present invention can be applied to an organic EL display device which is provided an organic EL luminescent layer between the counter electrodes thereof.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flat panel display device comprising:
   a thin film semiconductor switching element formed on a surface of a substrate;
   a display electrode connected with said switching element;
   a semiconductor layer for auxiliary capacity which is electrically connected with said display electrode;
   a dielectric layer formed on a surface of said semiconductor layer for auxiliary capacity; and
   a metal layer formed on a surface of said dielectric layer;
   wherein the auxiliary capacity is constituted by the semiconductor layer for auxiliary capacity, the dielectric layer, and the metal layer; and said switching element includes a channel region, and a semiconductor layer having source and drain regions disposed to sandwich the channel region therebetween and implanted respectively with an n-type or p-type impurity ion, the impurity ion having the same as the impurity ion concentration being implanted into the source/drain regions is implanted into the semiconductor layer for auxiliary capacity in the same step, a surface concentration of the n-type or p-type impurity ion is in the range of $3.2\times10^{19}$ to $2.0\times10^{20}$ atoms/cm$^3$.

2. The flat panel display device according to claim 1, wherein the number of defects per unit volume which exists in the gate insulating film of switching element and in the semiconductor layer is not more than $6.91 \times 10^{18}/cm^3$.

3. The flat panel display device according to claim 1, wherein said impurity ion is mainly formed of phosphorus.

4. The flat panel display device according to claim 1, wherein said substrate includes a driving circuit sending a signal to said display electrode, and said driving circuit includes a thin film transistor formed in the same step as that forming said switching element.

5. A flat panel display device comprising:
   a thin film semiconductor switching element, and a thin film semiconductor element for driving circuit, both being formed on a surface of a substrate;
   a display electrode connected with said switching element;
   a semiconductor layer for auxiliary capacity which is electrically connected with said display electrode;
   a dielectric layer formed on a surface of said semiconductor layer for auxiliary capacity; and
   a metal layer formed on a surface of said dielectric layer;
   wherein the auxiliary capacity is constituted by said semiconductor layer for auxiliary capacity, said dielectric layer, and said metal layer;
   said thin film semiconductor element for driving circuit is provided with a semiconductor layer having a channel region bearing thereon a gate insulating film, and source/drain regions sandwiching said gate insulating film, each of source/drain regions being implanted with a predetermined concentration of impurity ions; and
   said gate insulating film of said thin film semiconductor element for driving circuit contains not more than $1.1 \times 10^{13}/cm^2$ in the number of defects per unit area.

6. The flat panel display device according to claim 5, wherein the concentration of an n-type or p-type impurity ion in the semiconductor layer for auxiliary capacity is in the range of $3.2 \times 10^{19}$ to $2 \times 10^{20}$ atoms/cm$^3$.

7. A flat panel display device comprising:
   a thin film semiconductor switching element formed on a surface of a substrate;
   a display electrode connected with said switching element;
   a semiconductor layer for auxiliary capacity which is electrically connected with said display electrode;
   a dielectric layer formed on a surface of said semiconductor layer for auxiliary capacity; and
   a metal layer formed on a surface of said dielectric layer;
   wherein the auxiliary capacity is constituted by the semiconductor layer for auxiliary capacity, the dielectric layer, and the metal layer; and said switching element includes a channel region, and a semiconductor layer having source and drain regions disposed to sandwich the channel region therebetween and implanted respectively with an n-type or p-type impurity ion, the impurity ion having the same as the impurity ion concentration being implanted into the source/drain regions is implanted into the semiconductor layer for auxiliary capacity in the same step, a carrier concentration thereof is $1.6 \times 10^{19}$ atoms/cm$^3$ or more.

* * * * *